(12) United States Patent
Kitamura et al.

(10) Patent No.: US 9,735,007 B2
(45) Date of Patent: Aug. 15, 2017

(54) METHOD OF PROCESSING SUBSTRATE, SUBSTRATE PROCESSING APPARATUS, AND RECORDING MEDIUM

(71) Applicant: HITACHI KOKUSAI ELECTRIC INC., Tokyo (JP)

(72) Inventors: Masahito Kitamura, Toyama (JP); Takahiro Morikawa, Kokubunji (JP)

(73) Assignee: HITACHI KOKUSAI ELECTRIC, INC., Tokyo (JP)

(*) Notice: Subject to any disclaimer, the term of this patent is extended or adjusted under 35 U.S.C. 154(b) by 0 days.

(21) Appl. No.: 14/856,881

(22) Filed: Sep. 17, 2015

(65) Prior Publication Data

US 2016/0086801 A1     Mar. 24, 2016

(30) Foreign Application Priority Data

Sep. 18, 2014   (JP) .................. 2014-190437

(51) Int. Cl.
| | |
|---|---|
| *H01L 21/02* | (2006.01) |
| *C23C 16/52* | (2006.01) |
| *C23C 16/04* | (2006.01) |
| *C23C 16/30* | (2006.01) |
| *C23C 16/455* | (2006.01) |

(52) U.S. Cl.
CPC ........ *H01L 21/02568* (2013.01); *C23C 16/04* (2013.01); *C23C 16/305* (2013.01); *C23C 16/45523* (2013.01); *C23C 16/52* (2013.01); *H01L 21/0262* (2013.01); *H01L 21/02636* (2013.01)

(58) Field of Classification Search
None
See application file for complete search history.

(56) References Cited

U.S. PATENT DOCUMENTS

2007/0160760 A1* 7/2007 Shin ..................... C23C 16/305
                                                            427/255.35
2007/0246743 A1   10/2007 Cho et al.

FOREIGN PATENT DOCUMENTS

| JP | 2007-186784 A | 7/2007 |
| KR | 10-0695168 A | 3/2007 |
| KR | 10-0717286 A | 5/2007 |

OTHER PUBLICATIONS

Korean Office Action issued on Nov. 4, 2016 in the Korean Application No. 10-2015-0131784.

* cited by examiner

*Primary Examiner* — Jack Chen
(74) *Attorney, Agent, or Firm* — Volpe and Koenig, P.C.

(57) ABSTRACT

A method of processing a substrate includes: growing a first layer including a first element and a second element by supplying a first precursor containing the first element and a second precursor containing the second element to the substrate; and growing a second layer including the second element and a third element by supplying the second precursor and a third precursor containing the third element to the substrate. The act of growing the first layer and the act of growing the second layer are alternately performed a predetermined number of times, and the act of growing the first layer is performed before the act of growing the second layer to selectively grow a laminated film on a conductive film exposed on the surface of the substrate. The first layer and the second layer are laminated to form the laminated film.

10 Claims, 11 Drawing Sheets

METHOD OF PROCESSING SUBSTRATE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-190437, filed on Sep. 18, 2014, the entire contents of which are incorporated herein by reference.

TECHNICAL FIELD

The present disclosure relates to a method of processing a substrate, a substrate processing apparatus, and a recording medium.

BACKGROUND

As an example of processes of manufacturing a semiconductor device, a film forming process may be performed to grow a film (GeSbTe film) containing a semi-metal element such as, e.g., germanium (Ge), antimony (Sb), or tellurium (Te). In some cases, a laminated film formed by laminating an SbTe layer containing Sb and Te and a GeTe layer containing Ge and Te may be grown as a GeSbTe film containing Ge, Sb, and Te.

SUMMARY

The present disclosure provides some embodiments of a novel film forming technique which is applicable to the growth of a laminated film formed by laminating an SbTe layer containing Sb and Te and a GeTe layer containing Ge and Te.

According to one embodiment of the present disclosure, there is provided a technique of processing a substrate, which includes growing a first layer including a first element and a second element by supplying a first precursor containing the first element and a second precursor containing the second element to the substrate, an insulating film, and a conductive film containing at least one selected from a group consisting of a metal element, a semi-metal element, and a semiconductor element being exposed on a surface of the substrate, and growing a second layer including the second element and a third element by supplying the second precursor and a third precursor containing the third element to the substrate, wherein the act of growing the first layer and the act of growing the second layer are alternately performed a predetermined number of times, and the act of growing the first layer is performed before the act of growing the second layer to selectively grow a laminated film on the conductive film exposed on the surface of the substrate, the first layer and the second layer being laminated to form the laminated film.

DETAILED DESCRIPTION

One Embodiment of the Present Disclosure (1) Configuration of Substrate Processing Apparatus First, the configuration of a substrate processing apparatus according to this embodiment will be described with reference to FIGS. 2 to 4.

(Process Vessel)

Figure 2:
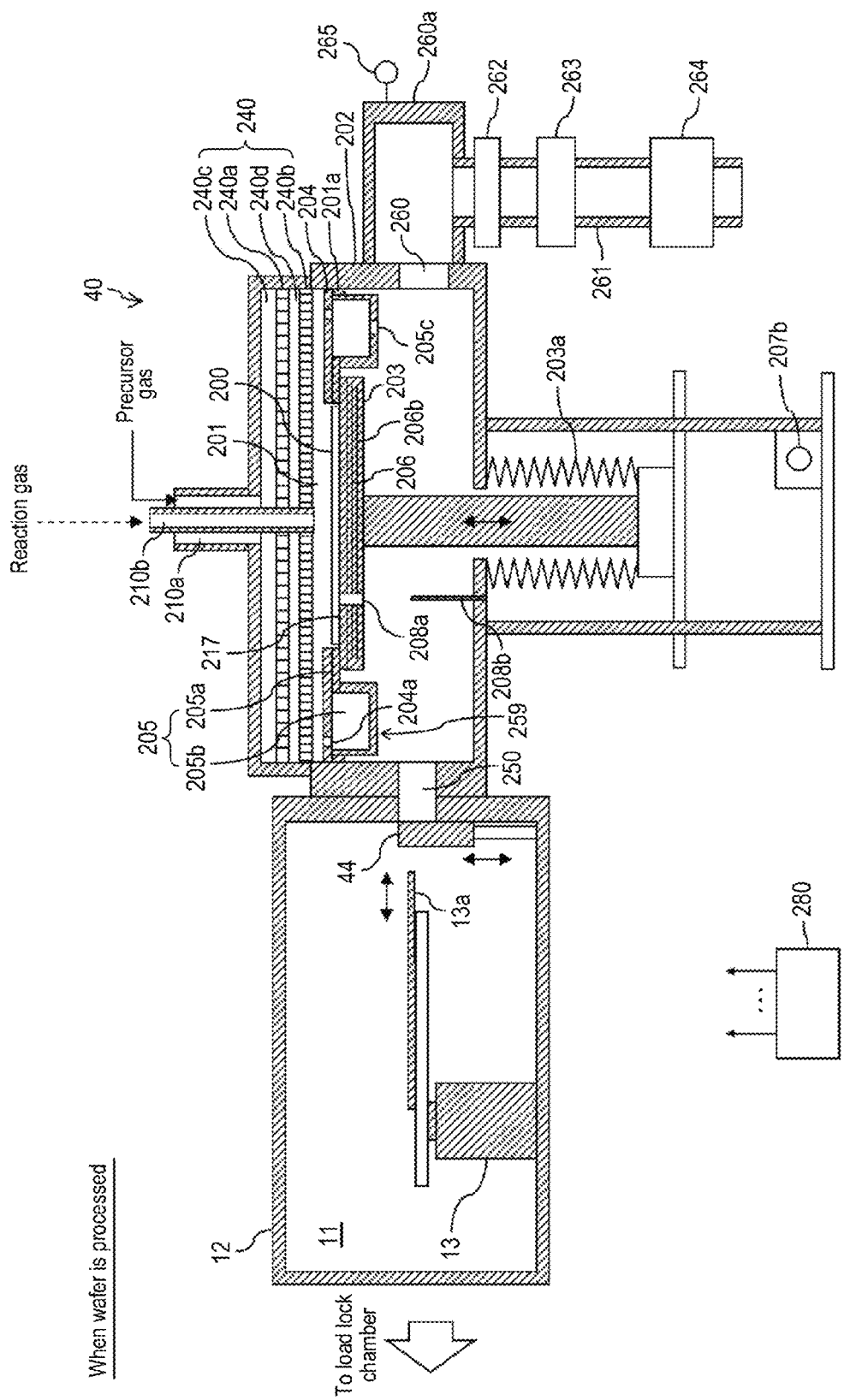
FIG. 2 is a cross-sectional view when a wafer of the substrate processing apparatus appropriately used in an embodiment of the present disclosure is processed.
Figure 3:
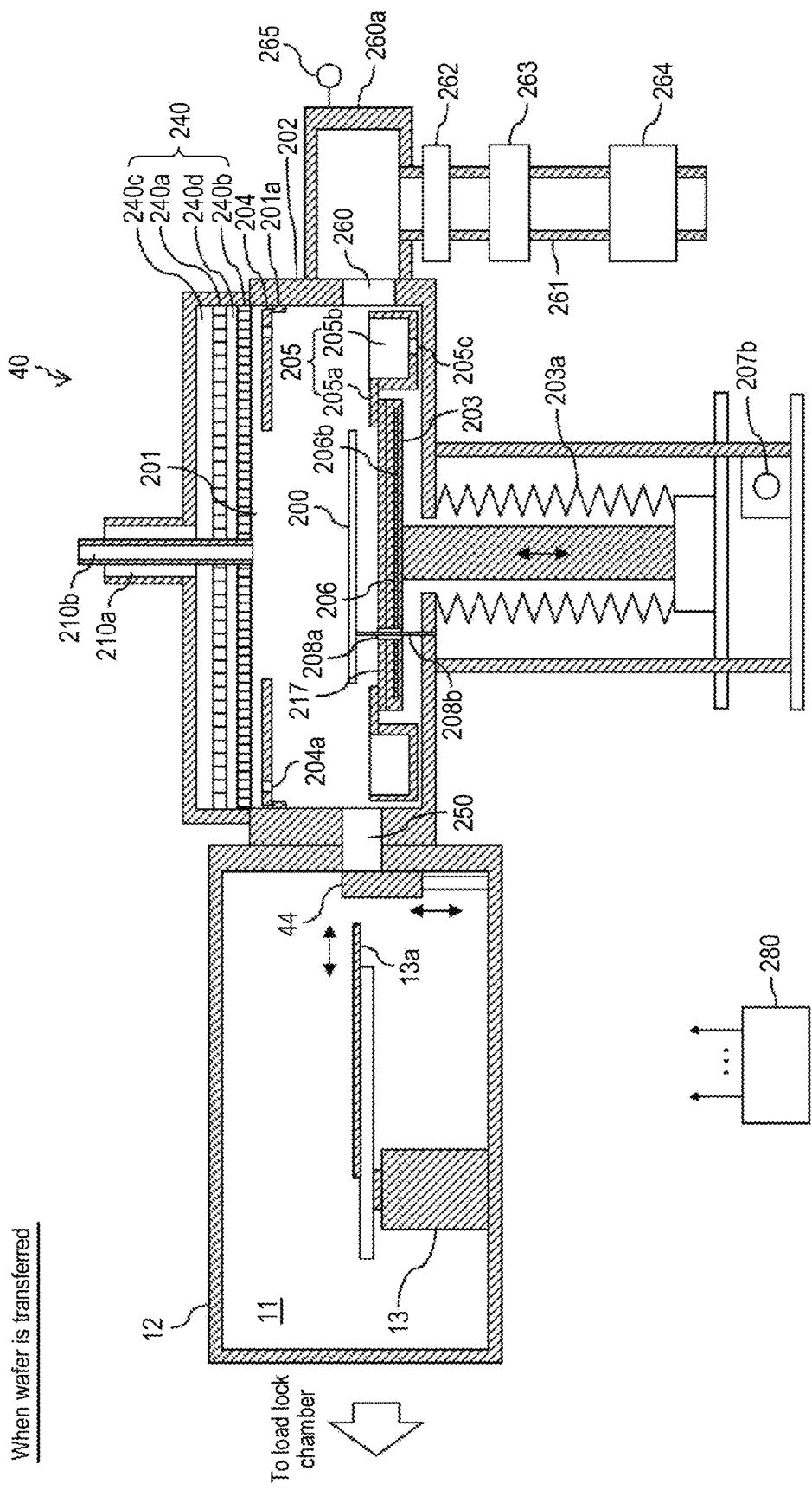
FIG. 3 is a cross-sectional view when a wafer of the substrate processing apparatus appropriately used in an embodiment of the present disclosure is transferred.

As illustrated in FIGS. 2 and 3, a substrate processing apparatus 40 according to this embodiment includes a process vessel 202. The process vessel 202 is configured as, e.g., a flat airtight vessel having a circular cross-section. Further, the process vessel 202 is formed of a metal material such as, e.g., aluminum (Al) or stainless steel (SUS). A process chamber 201 in which a wafer 200 as a substrate is processed is defined in the process vessel 202.

(Support Table)

A support table 203 configured to support the wafer 200 is installed in the process chamber 201. A susceptor 217, which is a support plate formed of, e.g., quartz ($SiO_2$), carbon, ceramics, silicon carbide (SiC), aluminum oxide ($Al_2O_3$), aluminum nitride (AlN), or the like, is installed at an upper surface of the support table 203, which is in direct contact with the wafer 200.

In addition, a heater 206 as a heating part (heating source) for heating the wafer 200, and a temperature sensor 206b as a temperature detector are incorporated in the support table 203. A temperature distribution of the wafer 200 supported on the susceptor 217 may have a desired temperature distribution by controlling a condition of current applying to the heater 206 based on temperature information detected by the temperature sensor 206b. A lower end portion of the support table 203 extends through a lower portion of the process vessel 202.

(Elevation Mechanism)

An elevation mechanism 207b for elevating and lowering the support table 203 is installed at an outside of the process chamber 201. By operating the elevation mechanism 207b to elevate or lower the support table 203, the wafer 200 supported on the susceptor 217 may be elevated or lowered. The support table 203 is lowered to a position (wafer transfer position), as illustrated in FIG. 3, when the wafer 200 is transferred, and the support table 203 is elevated to a position (wafer processing position), as illustrated in FIG. 2, when the wafer 200 is processed. A periphery of a lower end portion of the support table 203 is covered with a bellows 203a, and thus, the inside of the process chamber 201 is kept airtight.

(Lift Pin)

For example, three lift pins 208b are installed at a lower surface (bottom surface) of the process chamber 201 to rise in a vertical direction. Through holes 208a through which the lift pins 208b pass may be formed in the support table 203 (including also the susceptor 217) in positions corresponding to the lift pins 208b, respectively. When the support table 203 is lowered to the wafer transfer position, an upper end portion of the lift pin 208b protrudes from an upper surface of the susceptor 217 and the lift pin 208b supports the wafer 200 from below, as illustrated in FIG. 3. When the support table 203 is elevated to the wafer processing position, the lift pin 208b is buried from the upper surface of the susceptor 217 and the susceptor 217 supports the wafer 200 from below, as illustrated in FIG. 2. Since the lift pins 208b are in direct contact with the wafer 200, the lift pins 208b may be formed of a material such as, e.g., quartz or alumina oxide.

(Wafer Transfer Port)

A wafer transfer port 250 configured to allow the wafer 200 to be transferred to the interior or exterior of the process chamber 201 therethrough is formed on a side surface of an inner wall of the process chamber 201 (process vessel 202). A gate valve 44 is installed in the wafer transfer port 250, and when the gate valve 44 is opened, the interior of the process chamber 201 and the interior of a negative pressure transfer chamber 11 communicate with each other. The negative pressure transfer chamber 11 is defined within the transfer vessel (airtight vessel) 12, and a negative pressure transfer device 13 for transferring the wafer 200 is installed within the negative pressure transfer chamber 11. The negative pressure transfer device 13 includes a transfer arm 13a configured to support the wafer 200 when the wafer 200 is transferred. In a state where the support table 203 is lowered to the wafer transfer position, the gate valve 44 is opened so that the wafer 200 may be transferred by the negative pressure transfer device 13 between the interior of the process chamber 201 and the interior of the negative pressure transfer chamber 11. That is, the negative pressure transfer device 13 is configured as a transfer device (transfer mechanism) which transfers the wafer 200 to the interior or exterior of the process chamber 201.

The wafer 200 transferred to the process chamber 201 is temporarily loaded on the lift pins 208b as described above. Further, a load lock chamber (not shown) is installed at a side of the negative pressure transfer chamber 11 opposite to the side where the wafer transfer port 250 is formed, and the wafer 200 may be transferred by the negative pressure transfer device 13 between the interior of the load lock chamber and the interior of the negative pressure transfer chamber 11. The load lock chamber serves as a reserved chamber which temporarily accommodates the wafer 200 which has not yet been processed or which has been completely processed.

(Exhaust System)

An exhaust port 260 that exhausts an internal atmosphere of the process chamber 201 is formed on a side surface of an inner wall of the process chamber 201 (process vessel 202) and on the opposite side of the wafer transfer port 250. An exhaust pipe 261 is connected to the exhaust port 260 through an exhaust chamber 260a. A pressure sensor 265, which is a pressure detector (pressure detecting part) for detecting an internal pressure of the process chamber 201, is installed in the exhaust chamber 260a. A vacuum pump 264, which is a vacuum exhaust device, is connected to the exhaust pipe 261 through an auto pressure controller (APC) 262 as a pressure adjuster (pressure adjusting part) for controlling the internal pressure of the process chamber 201 to a predetermined pressure and a precursor collecting trap 263. Further, the APC valve 262 is a valve configured to perform/stop vacuum exhaust in the process chamber 201 by opening/closing a valve in a state where the vacuum pump 264 is in operation, and further to adjust the internal pressure of the process chamber 201 by adjusting a degree of the valve opening in a state where the vacuum pump 264 is in operation. An exhaust system (exhaust line) is mainly configured by the exhaust chamber 260a, the pressure sensor 265, the exhaust pipe 261, and the APC valve 262. The precursor collecting trap 263 and the vacuum pump 264 may also be included in the exhaust system. The exhaust system is configured to evacuate the interior of the process chamber 201 to have a predetermined pressure (vacuum level) by adjusting a degree of opening of the APC valve 262 based on pressure information detected by the pressure sensor 265, while operating the vacuum pump 264.

(Gas Supply Port)

A precursor gas supply port 210a for supplying a precursor gas containing a predetermined element into the process chamber 201 and a reaction gas supply port 210b for supplying a reaction gas into the process chamber 201 are formed on an upper surface (ceiling wall) of a shower head 240 described later, installed in an upper portion of the process chamber 201. That is, the reaction gas supply port 210b is formed independently from the precursor gas supply port 210a so that the precursor gas and the reaction gas may be supplied separately into the process chamber 201 from the different supply ports. Further, in FIGS. 2 and 3, a configuration in which the reaction gas supply port 210b is disposed to have a concentric circle with the reaction gas supply port 210b within the precursor gas supply port 210a is illustrated, but the present disclosure is not limited thereto and the reaction gas supply port 210b may be formed on an outer side of the precursor gas supply port 210a. A configuration of each gas supply system connected to the precursor gas supply port 210a and the reaction gas supply port 210b will be described later.

(Shower Head)

The shower head 240, which is a gas dispersing mechanism, is installed between the precursor gas supply port 210a and the process chamber 201. The shower head 240 includes a dispersing plate 240a for dispersing a precursor gas supplied from the precursor gas supply port 210a and a shower plate 240b for further uniformly dispersing the precursor gas which has passed through the dispersing plate 240a and supplying the precursor gas to a surface of the wafer 200 on the support table 203. The dispersing plate 240a and the shower plate 240b have a plurality of vent holes, respectively. The dispersing plate 240a is disposed to face an upper surface of the shower head 240 and the shower plate 240b, and the shower plate 240b is disposed to face the wafer 200 on the support table 203. In addition, spaces are formed between the upper surface of the shower head 240 and the dispersing plate 240a and between the dispersing plate 240a and the shower plate 240b, respectively. These spaces serve as a first buffer space (dispersing chamber) 240c configured to disperse the precursor gas supplied from the precursor gas supply port 210a and a second buffer space (spreading chamber) 240d configured to spread the precursor gas which has passed through the dispersing plate 240a, respectively.

The reaction gas supply port 210b extends through the shower head 240 in a vertical direction (thickness direction) such that a lower end opening thereof protrudes from a lower surface of the shower plate 240b toward the support table 203. That is, the reaction gas supply port 210b is configured to supply a reaction gas into the process chamber 201 from a lower side of the shower plate 240b, namely without passing through the shower head 240.

(Exhaust Duct)

A step portion 201a is installed in a side surface of an inner wall of the process chamber 201 (process vessel 202). And, the step portion 201a is configured to maintain a conductance plate 204 near the wafer processing position. The conductance plate 204 is configured as a sheet of disk plate having a donut shape (ring shape) having a hole formed in an inner circumferential portion to accommodate the wafer 200 therein. A plurality of outlets 204a, which are arranged in a circumferential direction at predetermined intervals, is formed in an outer circumferential portion of the conductance plate 204. The outlets 204a are discontinuously formed such that the outer circumferential portion of the conductance plate 204 may support the inner circumferential portion of the conductance plate 204.

Meanwhile, a lower plate 205 engages with an outer circumferential portion of the support table 203. The lower plate 205 includes a ring-shaped concave portion 205b and a flange portion 205a integrally installed in an inner upper portion of the concave portion 205b. The concave portion 205b is formed to fill a gap between an outer circumferential portion of the support table 203 and a side surface of an inner wall of the process chamber 201. A plate exhaust port 205c configured to allow a gas to be discharged (distributed) from the concave portion 205b toward the exhaust port 260 side therethrough is formed in a lower portion of the concave portion 205b near the exhaust port 260. The flange portion 205a serves as a locking portion supportedly hung on an upper outer circumference of the support table 203. Since the flange portion 205a is supportedly hung on the upper outer circumference of the support table 203, the lower plate 205 is elevated or lowered together with the support table 203 when the support table 203 is elevated or lowered.

When the support table 203 is elevated to the wafer processing position, the lower plate 205 is also elevated to the wafer processing position. As a result, the conductance plate 204 maintained near the wafer processing position fills the upper surface portion of the concave portion 205b of the lower plate 205, forming an exhaust duct 259 having the interior of the concave portion 205b as a gas flow path region. Further, here, the interior of the process chamber 201 is divided by the exhaust duct 259 (conductance plate 204 and the lower plate 205) and the support table 203 into an upper portion of process chamber 201 above the exhaust duct 259 (conductance plate 204 and the lower plate 205) and a lower portion of the process chamber 201 below the exhaust duct 259. The conductance plate 204 and the lower plate 205 may be formed of a material that can be maintained at high temperatures, for example, quartz which has high temperature resistance and is used for a large load, in consideration of a case of etching a reaction product deposited on an inner wall of the exhaust duct 259 (in case of self-cleaning).

Here, a flow of a gas within the process chamber 201 when the wafer is processed will be described.

A precursor gas supplied from the precursor gas supply port 210a to the upper portion of the shower head 240 flows from the plurality of vent holes of the dispersing plate 240a to the second buffer space 240d through the first buffer space (dispersing chamber) 240c, and is also supplied into the process chamber 201 by passing through the plurality of vent holes of the shower plate 240b. Further, a reaction gas supplied from the reaction gas supply port 210b is supplied into the process chamber 201 from a lower side of the shower plate 240b, that is, without passing through the shower head 240. That is, the precursor gas supplied from the precursor gas supply port 210a and the reaction gas supplied from the reaction gas supply port 210b are separately supplied into the process chamber 201. In addition, when the precursor gas and the reaction gas are simultaneously supplied into the process chamber 201, the precursor gas and the reaction gas are first mixed within the process chamber 201, rather than being mixed previously.

Each of the precursor gas and the reaction gas is evenly supplied to the wafer 200 and radially flows to an outer side of the wafer 200 in a diameter direction. Then, a surplus gas after the gas has come into contact with the wafer 200 radially flows on the exhaust duct 259 positioned in an outer circumferential portion of the wafer 200, namely, on the conductance plate 204, toward an outer side of the wafer 200 in the diameter direction, so as to be discharged from the outlets 204a formed in the conductance plate 204 to the interior of the gas flow path region (concave portion 205b) of the exhaust duct 259. Thereafter, the gas flows into the exhaust duct 259 is exhausted to the exhaust port 260 by way of the plate exhaust port 205c. By making the gas flow in this manner, the gas is restrained from flowing around to a lower portion of the process chamber 201, namely, to a rear surface of the support table 203 or a lower surface side of the process chamber 201.

Figure 1:
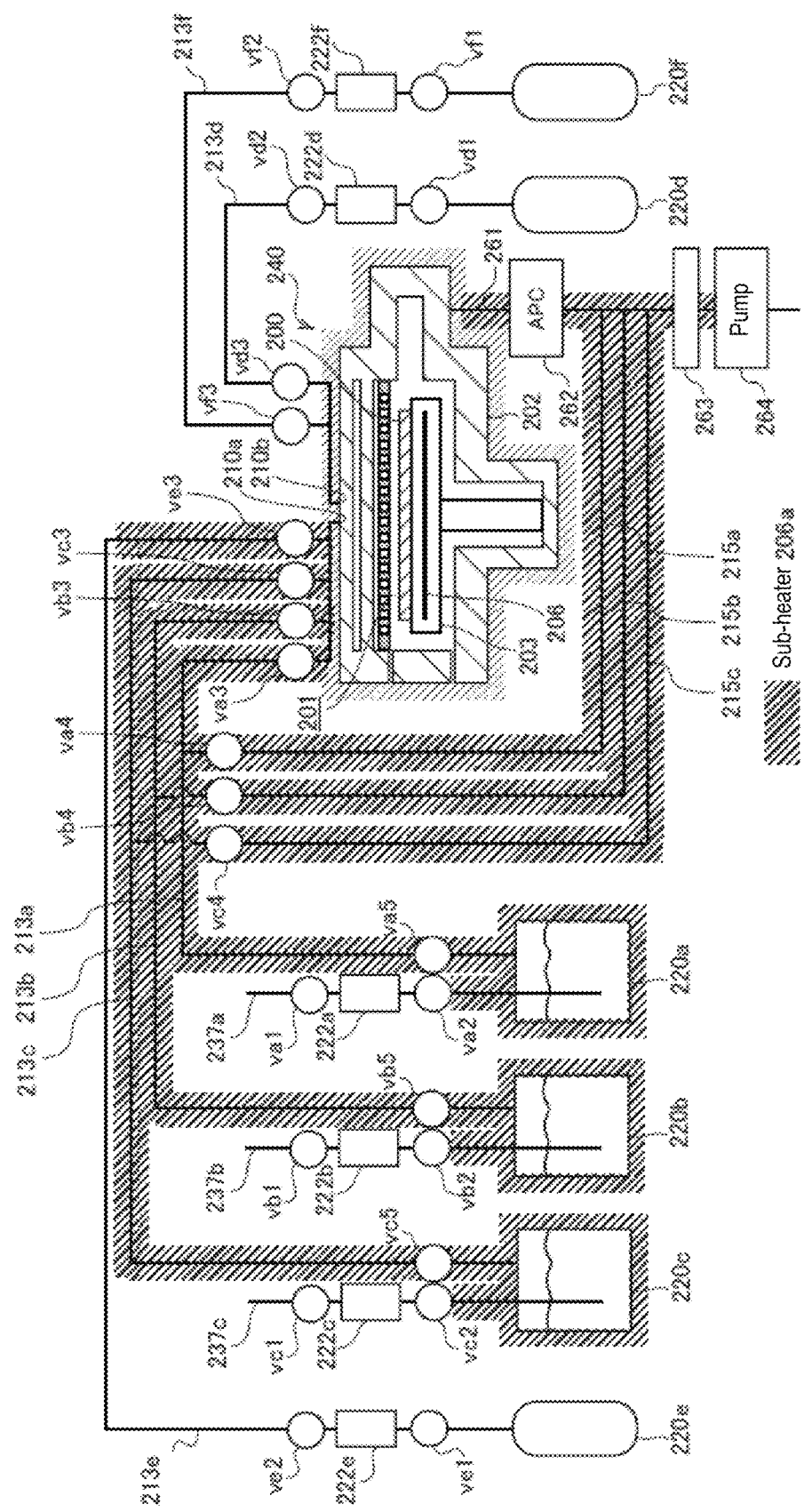
FIG. 1 is a view illustrating a configuration of a gas supply system of a substrate processing apparatus appropriately used in an embodiment of the present disclosure.

Subsequently, a configuration of the gas supply system connected to the precursor gas supply port 210a and the reaction gas supply port 210b described above will be described with reference to FIG. 1.

The gas supply system of the substrate processing apparatus 40 according to this embodiment includes bubblers 220a, 220b, and 220c, which are vaporizers for vaporizing a liquid precursor in a liquid state under room temperature and normal pressure, a precursor gas supply system for supplying precursor gases produced by vaporizing the liquid precursor using the bubblers 220a, 220b, and 220c into the process chamber 201, a reaction gas supply system for supplying a reaction gas into the process chamber 201, and an inert gas supply system for supplying an inert gas into the process chamber 201. In addition, the substrate processing apparatus 40 includes a vent (bypass) system for exhausting the precursor gases from the bubblers 220a, 220b, and 220c to bypass the process chamber 201, without being supplied into the process chamber 201. Hereinafter, the configurations of respective parts will be described.

(Bubbler)

The bubblers 220a, 220b, and 220c, which are precursor vessels each accommodating a liquid precursor, are installed at the outside of the process chamber 201. The bubblers

220a, 220b, and 220c are configured as tanks (airtight vessels) each accommodating (or charging) a liquid precursor therein, and also configured as vaporizing parts for vaporizing a liquid precursor through bubbling to produce a precursor gas. Further, a sub-heater 206a is installed on the circumferences of the bubblers 220a, 220b, and 220c to heat the bubblers 220a, 220b, and 220c and the internal liquid precursor.

Precursors containing different predetermined elements are accommodated in the bubblers 220a, 220b, and 220c. In this embodiment, the following precursors are accommodated in the bubblers 220a, 220b, and 220c. An antimony precursor (Sb precursor) containing Sb as a first precursor containing a first predetermined element is accommodated in the bubbler 220a. A tellurium precursor (Te precursor) containing Te as a second precursor containing a second predetermined element is accommodated in the bubbler 220b. A germanium precursor (Ge precursor) containing Ge as a third precursor containing a third predetermined element is accommodated in the bubbler 220c.

Each of the Sb precursor, the Te precursor, and the Ge precursor used herein is in a liquid state at room temperature and normal pressure.

Further, when the term "precursor" is used herein, it may refer to "a liquid precursor in a liquid state," "a precursor gas obtained by vaporizing a liquid precursor", or both of them.

As the Sb precursor, specifically, an Sb precursor containing at least one of an alkyl group and an amino group may be used, and more specifically, an Sb precursor containing the alkyl group may be used. As such an Sb precursor, for example, trisdimethylaminoantimony ($Sb[N(CH_3)_2]_3$, abbreviation: TDMASb) may be used, and besides, for example, triisopropylantomony ($Sb(i-C_3H_7)_3$, abbreviation: TIPSb), triethylantimony ($Sb(C_2H_5)_3$, abbreviation: TESb), tert-butyldimethylantimony (($t-C_4H_9)Sb(CH_3)_2$, abbreviation: TBDMSb), or the like may be used.

As the Te precursor, specifically, a Te precursor containing an alkyl group may be used. As such a Te precursor, for example, di-t-butyltellurium ($Te(t-C_4H_9)_2$, abbreviation: DTBTe) may be used, and besides, for example, diisopropyltellurium ($Te(i-C_3H_7)_2$, abbreviation: DIPTe), dimethyltellurium ($Te(CH_3)_2$, abbreviation: DMTe), diethyltellurium ($Te(C_2H_5)_2$, abbreviation: DETe), or the like may be used.

As the Ge precursor, specifically, a Ge precursor containing at least one of an amino group and an amidine group may be used, and more specifically, a Ge precursor containing the amidine group may be used. Further, as the Ge precursor, specifically, a Ge precursor having a Ge atom to which three or less legands are bonded may be used, and more specifically, a Ge precursor having a Ge atom to which two legands are bonded may be used. Here, legand is a material bonded to an atom of a predetermined element (here, Ge), and refers to a material containing at least one element of carbon (C), hydrogen (H), oxygen (O), and nitrogen (N). In addition, in a case in which a plurality of legands is bonded to one predetermined element, all legands may be homogeneous materials or heterogeneous materials.

Figure 8:
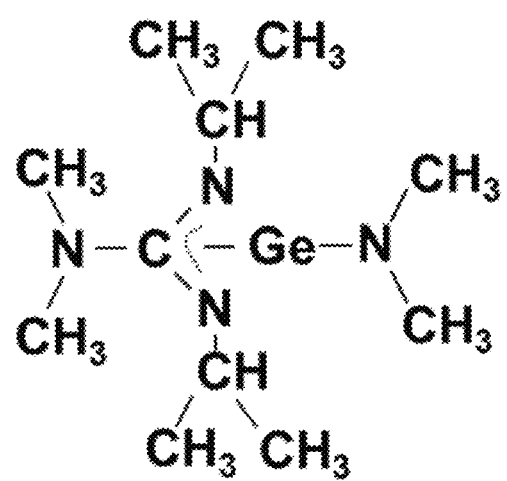
FIG. 8 is a view illustrating a chemical formula of a Ge precursor according to an example.

As such a Ge precursor, for example, a Ge precursor having a chemical formula illustrated in FIG. 8 may be used. The Ge precursor having the chemical formula illustrated in FIG. 8 may also be simply referred to as a Ge precursor of FIG. 8. The Ge precursor of FIG. 8 is a Ge precursor containing an amino group and an amidine group and having a Ge atom with two legands bonded thereto. In the Ge precursor of FIG. 8, chemical structures of the two legands bonded to the Ge atom are different and has an asymmetrical molecular structure, rather than a symmetrical molecular structure.

In addition to the Ge precursor of FIG. 8, the Ge precursor containing at least one of the amino group and the amidine group may be, for example, $Ge[N(CH_3)_2]_4$. Further, in addition to the Ge precursor of FIG. 8, the Ge precursor having a Ge atom with two legands bonded thereto may be, for example, a Ge precursor having a Ge atom, such as $GeCl_2$, $GeF_2$, or $GeBr_2$, with a halogen group as two legands bonded thereto.

Carrier gas supply pipes 237a, 237b, and 237c are connected to the bubblers 220a, 220b, and 220c, respectively. Carrier gas supply sources (not shown) are connected to upstream side end portions of the carrier gas supply pipes 237a, 237b, and 237c, respectively. Further, downstream side end portions of the carrier gas supply pipes 237a, 237b, and 237c are immersed in the liquid precursors that are accommodated within the bubblers 220a, 220b, and 220c, respectively.

A mass flow controller (MFC) 222a, which is a flow rate controller for controlling a supply flow rate of a carrier gas, and valves va1 and va2 for controlling a supply of the carrier gas are installed in the carrier gas supply pipe 237a. Further, an MFC 222b, which is a flow rate controller for controlling a supply flow rate of a carrier gas, and valves vb1 and vb2 for controlling supply of the carrier gas are installed in the carrier gas supply pipe 237b. Also, an MFC 222c, which is a flow rate controller controlling a supply flow rate of a carrier gas, and valves vc1 and vc2 for controlling supply of the carrier gas are installed in the carrier gas supply pipe 237c.

As the carrier gas, specifically, a gas that does not react with a liquid precursor may be used, and for example, an inert gas such as a $N_2$ gas, an Ar gas, or a H2 gas may be appropriately used. The carrier gas supply system (carrier gas supply line) is mainly configured by the carrier gas supply pipes 237a, 237b, and 237c, the MFCs 222a, 222b, and 222c, and valves va1, va2, vb1, vb2, vc1, and vc2.

With the foregoing configuration, the valves va1 and va2 are opened, and a carrier gas supplied from the carrier gas supply pipe 237a and controlled in a flow rate by the MFC 222a is supplied into the bubbler 220a, to allow the first liquid precursor (Sb liquid precursor) accommodated within the bubbler 220a to be vaporized through bubbling so as to produce a first precursor gas containing a first predetermined element, namely, an Sb precursor gas containing Sb (Sb-containing gas).

Further, the valves vb1 and vb2 are opened, and a carrier gas controlled in a flow rate by the MFC 222b is supplied from the carrier gas supply pipe 237b into the bubbler 220b, to allow the second liquid precursor (Te liquid precursor) accommodated within the bubbler 220b to be vaporized through bubbling so as to produce a second precursor gas containing a second predetermined element, namely, a Te precursor gas containing Te (Te-containing gas).

Also, the valves vc1 and vc2 are opened, and a carrier gas controlled in a flow rate by the MFC 222c is supplied from the carrier gas supply pipe 237c into the bubbler 220c, to allow the third liquid precursor (Ge liquid precursor) accommodated within the bubbler 220c to be vaporized through bubbling so as to produce a third precursor gas containing a third predetermined element, namely, a Ge precursor gas containing Ge (Ge-containing gas).

(Precursor Gas Supply System)

Precursor gas supply pipes 213a, 213b, and 213c for supplying each of precursor gases generated by the bubblers 220a, 220b, and 220c into the process chamber 201 are connected to the bubblers 220a, 220b, and 220c, respectively. Upstream side end portions of the precursor gas supply pipes 213a, 213b, and 213c communicate with spaces that are present in upper portions of the bubblers 220a, 220b, and 220c, respectively. Downstream side end portions of the precursor gas supply pipes 213a, 213b, and 213c are connected to join the precursor gas supply port 210a.

Valves va5 and va3 are installed in the precursor gas supply pipe 213a in this order from the upstream side. The valve va5 is a valve for controlling the supply of the first precursor gas from the bubbler 220a into the precursor gas supply pipe 213a, and is installed near the bubbler 220a. The valve va3 is a valve for controlling the supply of the first precursor gas from the precursor gas supply pipe 213a into the process chamber 201, and is installed near the precursor gas supply port 210a.

Further, valves vb5 and vb3 are installed in the precursor gas supply pipe 213b in this order from the upstream side. The valve vb5 is a valve for controlling the supply of the second precursor gas from the bubbler 220b into the precursor gas supply pipe 213b, and is installed near the bubbler 220b. The valve vb3 is a valve for controlling the supply of the second precursor gas from the precursor gas supply pipe 213b into the process chamber 201, and is installed near the precursor gas supply port 210a.

Also, valves vc5 and vc3 are installed in the precursor gas supply pipe 213c in this order from the upstream side. The valve vc5 is a valve for controlling the supply of the third precursor gas from the bubbler 220c into the precursor gas supply pipe 213c, and is installed near the bubbler 220c. The valve vc3 is a valve for controlling the supply of the third precursor gas from the precursor gas supply pipe 213c into the process chamber 201, and is installed near the precursor gas supply port 210a.

The valves va3, vb3, and vc3 and a valve ve3 described later are configured as, for example, highly durable high speed gas valves. The highly durable high speed gas valves are integrated valves configured to quickly switch gas supply and allow for gas exhaust in a short time. Further, the valve ve3 is a valve for controlling the supply of an inert gas for purging a space between the valves va3, vb3, and vc3 of the precursor gas supply pipes 213a, 213b, and 213c and the precursor gas supply port 210a at a high speed, and subsequently purging the interior of the process chamber 201.

With the foregoing configuration, the first liquid precursor may be vaporized by the bubbler 220a to produce a first precursor gas, and the valves va5 and va3 are opened to supply the first precursor into the process chamber 201 from the precursor gas supply pipe 213a. The Sb precursor gas supply system (Sb-containing gas supply system) as a first precursor gas supply system (first precursor gas supply line) is mainly configured by the precursor gas supply pipe 213a and the valves va5 and va3.

Further, the second liquid precursor may be vaporized by the bubbler 220b to produce a second precursor gas, and the valves va5 and va3 are opened to supply the second precursor into the process chamber 201 from the precursor gas supply pipe 213b. The Te precursor gas supply system (Te-containing gas supply system) as a second precursor gas supply system (second precursor gas supply line) is mainly configured by the precursor gas supply pipe 213b and the valves vb5 and vb3.

Also, the third liquid precursor may be vaporized by the bubbler 220c to produce a third precursor gas, and the valves vc5 and vc3 are opened to supply the third precursor into the process chamber 201 from the precursor gas supply pipe 213c. The Ge precursor gas supply system (Ge-containing gas supply system) as a third precursor gas supply system (third precursor gas supply line) is mainly configured by the precursor gas supply pipe 213c and the valves vc5 and vc3.

Further, the precursor gas supply system (precursor gas supply line) is mainly configured by the first to third precursor gas supply systems (first to third precursor gas supply lines). Also, the precursor supply system (precursor supply line) is mainly configured by the carrier gas supply system, the bubblers 220a, 220b, and 220c, and the precursor gas supply systems.

(Reaction Gas Supply System)

A reaction gas supply source 220d for supplying a reaction gas is installed at the outside of the process chamber 201. An upstream side end portion of a reaction gas supply pipe 213d is connected to the reaction gas supply source 220d. A downstream side end portion of the reaction gas supply pipe 213d is connected to the reaction gas supply port 210b through a valve vd3. An MFC 222d, which is a flow rate controller for controlling a supply flow rate of a reaction gas, and valves vd1, vd2, and vd3 for controlling the supply of the reaction gas are installed in the reaction gas supply pipe 213d. As the reaction gas, for example, an ammonia (NH3) gas is used. A $NH_3$ gas supply system ($NH_3$ gas supply line) as a reaction gas supply system (reaction gas supply line) is mainly configured by the reaction gas supply pipe 213d, the MFC 222d, and the valves vd1, vd2, and vd3. The reaction gas supply source 220d may also be included in the reaction gas supply system. The reaction gas supply system (reaction gas supply line) may be also called a reducing gas supply system (reducing gas supply line), or a hydrogen-containing gas supply system (hydrogen-containing gas supply line).

(Inert Gas Supply System)

Further, inert gas supply sources 220e and 220f for supplying an inert gas as a purge gas are installed at the outside of the process chamber 201. Upstream side end portions of reaction gas supply pipes 213e and 213f are connected to the inert gas supply sources 220e and 220f, respectively. A downstream side end portion of the inert gas supply pipe 213e is connected to the precursor gas supply port 210a through a valve ve3. A downstream side end portion of the inert gas supply pipe 213f is connected to the reaction gas supply port 210b through a valve vf3. An MFC 222e, which is a flow rate controller for controlling a supply flow rate of an inert gas, and valves ve1, ve2, and ve3 for controlling the supply of the inert gas are installed in the inert gas supply pipe 213e. An MFC 222f, which is a flow rate controller for controlling a supply flow rate of an inert gas, and valves vf1, vf2, and vf3 for controlling the supply of the inert gas are installed in the inert gas supply pipe 213f.

Examples of the inert gas may include a rare gas such as, e.g., a $N_2$ gas, an Ar gas, or a He gas. An inert gas supply system (inert gas supply line) as a purge gas supply system (purge gas supply line) is mainly configured by the inert gas supply pipes 213e and 213f, the MFCs 222e and 222f, and the valves ve1, ve2, ve3, vf1, vf2, and vf3. The inert gas supply sources 220e and 220f may also be included in the inert gas supply system. The inert gas supplied from the inert gas supply system also acts as a carrier gas for promoting the supply or diffusion of a precursor gas or a reaction gas into the process chamber 201, or as a dilution gas for adjusting a concentration or partial pressure of a precursor gas or a reaction gas within the process chamber 201.

(Vent (Bypass) System)

Upstream side end portions of vent pipes 215a, 215b, and 215c are respectively connected to upstream sides, relative to the valves va3, vb3, and vc3 of the precursor gas supply pipes 213a, 213b, and 213c. Downstream side end portions of the vent pipes 215a, 215b, and 215c are connected to a downstream side, relative to the APC valve 262 of the exhaust pipe 261 but to an upstream side, relative to the precursor collecting trap 263. Valves va4, vb4, and vc4 for controlling the distribution of a gas are installed in the vent pipes 215a, 215b, and 215c, respectively.

With the foregoing configuration, the valve va3 is closed and the valve va4 is opened, to allow the first precursor gas flowing in the precursor gas supply pipe 213a to bypass the process chamber 201 through the vent pipe 215a, without being supplied into the process chamber 201, so as to be exhausted from the exhaust pipe 261. Further, the valve vb3 is closed and the valve vb4 is opened to bypass the process chamber 201 through the vent pipe 215b, without supplying the second precursor gas flowing in the precursor gas supply pipe 213b into the process chamber 201, so as to exhaust the gas from the exhaust pipe 261. In addition, the valve vc3 is closed and the valve vc4 is opened to bypass the process chamber 201 through the vent pipe 215c, without supplying the third precursor gas flowing in the precursor gas supply pipe 213c into the process chamber 201, so at to exhaust the gas from the exhaust pipe 261.

A vent system (vent line) is mainly configured by the vent pipes 215a, 215b, and 215c and the valves va4, vb4, and vc4.

Further, as described above, the sub-heater 206a is installed on the circumferences of the bubblers 220a, 220b, and 220c, and in addition, the sub-heater 206a is also installed on the circumferences of the carrier gas supply pipes 237a, 237b, and 237c, the precursor gas supply pipes 213a, 213b, and 213c, at least a portion of the inert gas supply pipe 213e, the vent pipes 215a, 215b, and 215c, the exhaust pipe 261, the process vessel 202, the shower head 240, and the like. It is configured such that the sub-heater 206a heats these members to a temperature of, for example, 100 degrees C. or lower, to prevent the precursor gas within these members from being re-liquefied.

(Control Part)

Figure 4:
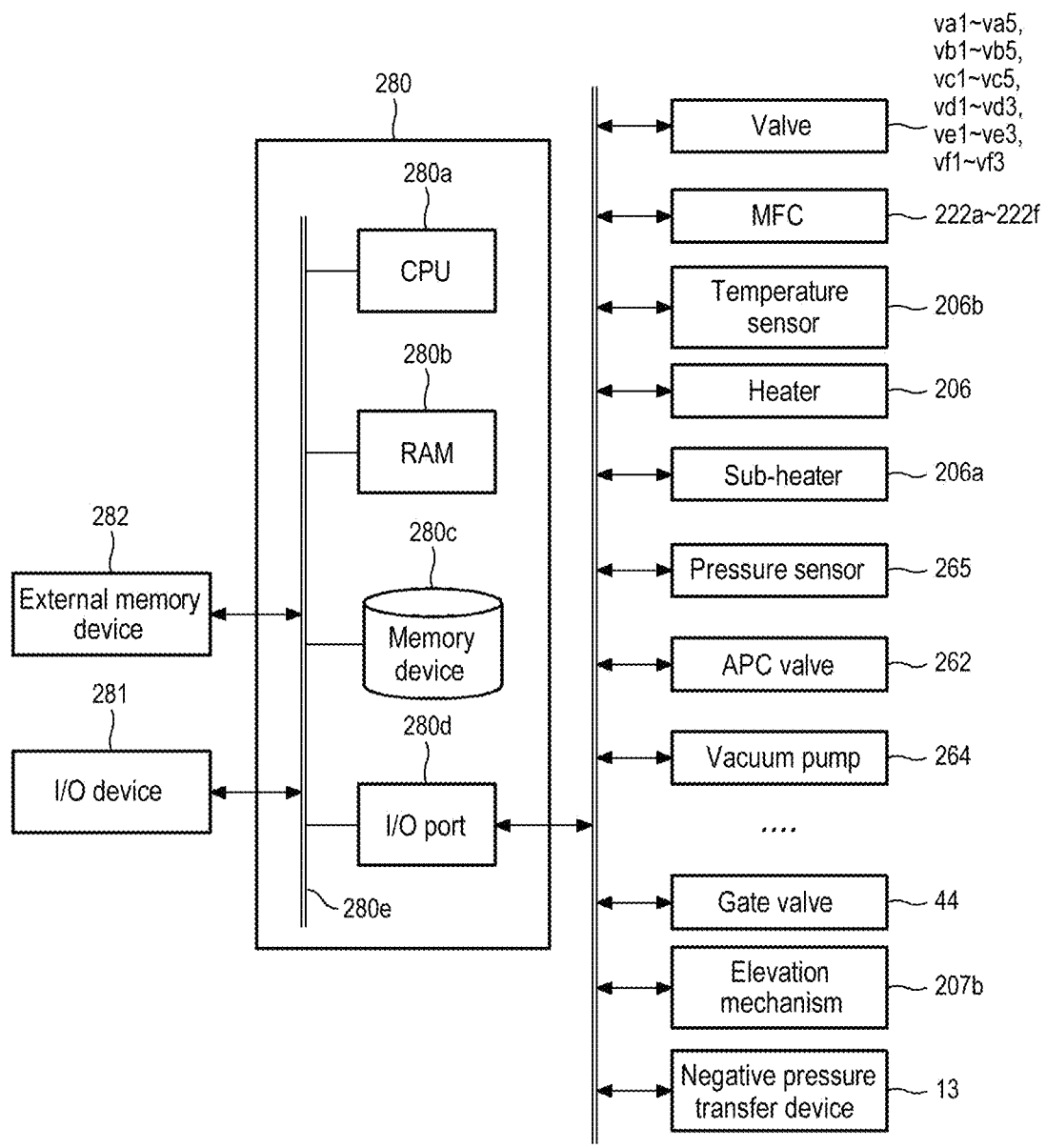
FIG. 4 is a schematic configuration view of a controller of the substrate processing apparatus appropriately used in an embodiment of the present disclosure.

As illustrated in FIG. 4, a controller 280 serving as a control part (control unit) is configured as a computer including a central processing unit (CPU) 280a, a random access memory (RAM) 280b, a memory device 280c, and an I/O port 280d. The RAM 280b, the memory device 280c, and the I/O port 280d are configured to exchange data with the CPU 280a via an internal bus 280e. An input/output device 281 configured as, e.g., a touch panel or the like, is connected to the controller 280.

The memory device 280c is configured with, for example, a flash memory, a hard disc drive (HDD), or the like. A control program for controlling the operations of the substrate processing apparatus 40, a process recipe in which a sequence, condition, or the like for a substrate processing process described later is written, and the like are readably stored in the memory device 280c. In addition, the process recipe, which is a combination of sequences, causes the controller 280 to execute each sequence in a substrate processing process described later in order to obtain a predetermined result, and functions as a program. Hereinafter, the program recipe, the control program, or the like may be generally referred to simply as a program. When the term "program" is used herein, it may include a case in which only the process recipe is included, a case in which only the control program is included, or a case in which both the process recipe and the control program are included. Further, the RAM 280b is configured as a memory area (work area) in which a program, data, or the like read by the CPU 280a is temporarily stored.

The I/O port 280d is connected to the valves va1 to va5, vb1 to vb5, vc1 to vc5, vd1 to vd3, ve1 to ve3, and vf1 to vf3, the MFCs 222a to 222f, the temperature sensor 206b, the heater 206, the sub-heater 206a, the pressure sensor 265, the APC valve 262, the vacuum pump 264, the gate valve 44, the elevation mechanism 207b, the negative pressure transfer device 13, and the like, as described above.

The CPU 280a is configured to read and execute the control program from the memory device 280c, and also to read the process recipe from the memory device 280c depending on an input of an operation command from the input/output device 281, or the like. Further, the CPU 280a is configured to control the flow rate adjusting operation of various kinds of gases by the MFCs 222a to 222f, the opening/closing operation of the valves va1 to va5, vb1 to vb5, vc1 to vc5, vd1 to vd3, ve1 to ve3, and vf1 to vf3, the pressure adjusting operation by the APC valve 262 based on the opening/closing operation of the APC valve 262 and the pressure sensor 265, the starting and stopping operation of the vacuum pump 264, the temperature adjusting operation of the heater 206 based on the temperature sensor 206b, the temperature adjusting operation of the sub-heater 206a, the opening/closing operation of the gate valve 44, the elevation and lowering operation of the elevation mechanism 207b, the transfer operation of the negative pressure transfer device 13, and the like, depending on the contents of the read process recipe.

In addition, the controller 280 is not limited to being configured as a dedicated computer but may be configured as a general-purpose computer. For example, the controller 280 of this embodiment may be configured by preparing the external memory device 282 (e.g., a magnetic tape, a magnetic disc such as a flexible disc or a hard disc, an optical disc such as a CD or DVD, a magneto-optical disc such as an MO, or a semiconductor memory such as a USB memory or a memory card), in which the program is stored, and installing the program on the general-purpose computer using the external memory device 282. Further, a means for supplying a program to the computer is not limited to the case in which the program is supplied through the external memory device 282. For example, the program may be supplied using a communication means such as the Internet or a dedicated line, rather than through the external memory device 282. Also, the memory device 280c or the external memory device 282 is configured as a non-transitory computer-readable recording medium. Hereinafter, these means for supplying the program will be generally referred to simply as "a recording medium". Additionally, when the term "recording medium" is used herein, it may include a case in which only the memory device 280c is included, a case in which only the external memory device 282 is included, or a case in which both the memory device 280c and the external memory device 282 are included.

(2) Substrate Processing Process

A film forming sequence of growing a laminated film on a substrate, which is one of the manufacturing processes of a semiconductor device using the above-described substrate processing apparatus, will be described with reference to FIG. 5. In the following description, the operations of respective parts that constitute the substrate processing apparatus are controlled by the controller 280.

Figure 5:
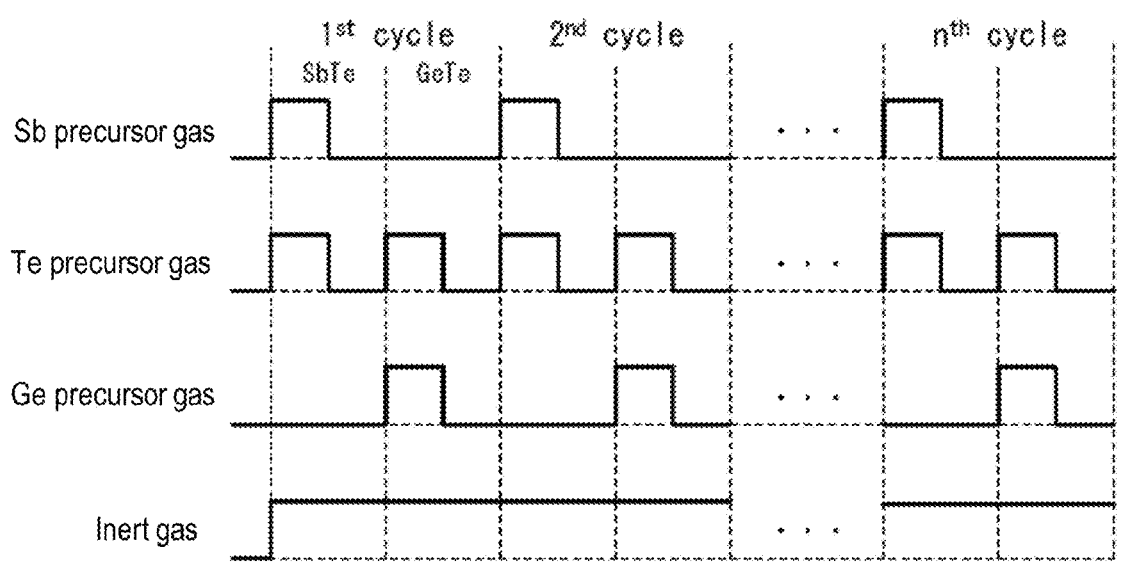
FIG. 5 is a timing chart illustrating a gas supply timing in a film forming sequence of an embodiment of the present disclosure.

In the film forming sequence illustrated in FIG. 5, a process of supplying an Sb precursor as a first precursor containing Sb as a first element and a Te precursor as a second precursor containing Te as a second element to the wafer 200 as a substrate in which a conductive film containing a metal element, a semi-metal element, or a semi-conductor element, and an insulating film are exposed on a surface thereof, to grow an SbTe layer as a first layer containing the first element and the second element, a process of supplying a Te precursor and a Ge precursor as a third precursor containing Ge as a third element to the wafer 200 to grow a GeTe layer as a second layer containing the second element and the third element, and a process of alternately performing the processes of supplying a predetermined number of times, wherein the process of growing the SbTe layer is performed before the process of growing the GeTe layer, to grow a laminated film formed by selectively laminating the SbTe layer and the Ge Te layer on the conductive film exposed on the surface of the wafer 200.

Further, in the present disclosure, the term "wafer" may be used for referring to not only a "wafer per se" but also a laminated body (aggregate) of a "wafer and certain layers or films formed on a surface of the wafer", that is, a wafer including certain layers or films formed (or grown) on a surface of the wafer is sometimes referred to as a wafer. Also, in the present disclosure, the term "surface of a wafer" may mean a "surface (exposed surface) of a wafer per se", or a "surface of a certain layer or film formed (or grown) on the wafer, namely an outermost surface of the wafer as a laminated body".

Thus, in the present disclosure, the expression "supplying a specified gas to a wafer" may mean that the "specified gas is directly supplied to a surface (exposed surface) of a wafer per se", or that the "specified gas is supplied to a layer or film formed (or grown) on the wafer, namely to an outermost surface of the wafer as a laminated body". Also, in the present disclosure, the expression "forming (or growing) a certain layer (or film) on a wafer" may mean that the "certain layer (or film) is directly formed (or grown) on the surface (exposed surface) of the wafer per se", or that the "certain layer (or film) is formed (or grown) on a layer or film formed (or grown) on the wafer, namely on an outermost surface of the wafer as a laminated body".

In the present disclosure, the term "substrate" is interchangeably used with the term "wafer." Thus, with regard to the above-mentioned description, the term "wafer" may be substituted with the term "substrate".

(Substrate Loading and Substrate Mounting)

The elevation mechanism 207b is operated to lower the support table 203 to the wafer transfer position illustrated in FIG. 3. Then, the gate valve 44 is opened to allow the process chamber 201 and the negative pressure transfer chamber 11 to communicate with each other. Thereafter, as described above, the wafer 200 supported by the transfer arm 13a is loaded from the negative pressure transfer chamber 11 into the process chamber 201 by the negative pressure transfer device 13. The wafer 200 loaded into the process chamber 201 is temporarily mounded on the lift pins 208b that protrude from the upper surface of the support table 203. When the transfer arm 13a of the negative pressure transfer device 13 is returned from the process chamber 201 into the negative pressure transfer chamber 11, the gate valve 44 is closed.

Subsequently, the elevation mechanism 207b is operated to elevate the support table 203 to the wafer processing position illustrated in FIG. 2. As a result, the lift pins 208b are buried from the upper surface of the support table 203 and the wafer 200 is mounted on the susceptor 217 on the upper surface of the support table 203.

Figure 6A:
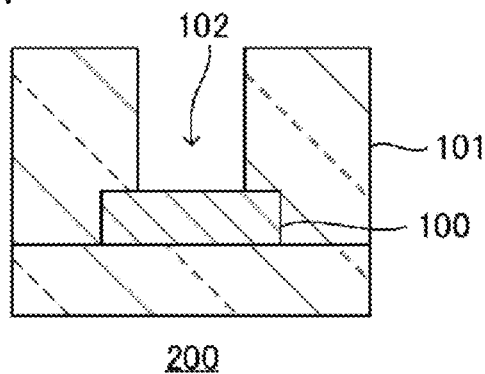
FIGS. 6A to 6C are cross-sectional views schematically illustrating a substrate processing process of an embodiment of the present disclosure.

The wafer 200 in a state of being mounted on the susceptor 217, that is, the wafer 200 in a state before all of a first layer, a second layer, and a laminated film described later are grown will be referred to as an "initial wafer 200". An example of a structure of the initial wafer 200 will be described with reference to FIG. 6A.

The initial wafer 200 has a structure in which the conductive film 100 and the insulating film 101 are exposed on a surface thereof. More specifically, for example, this structure is realized by forming a concave portion 102 in the insulating film 101 formed to cover the conductive film 100 formed on an upper portion of a substrate such as a silicon wafer, such that a lower surface of the concave portion 102 reaches the conductive film 100. The conductive film is exposed on the lower surface of the concave portion 102 formed on the surface of the wafer 200, and the insulating film 101 is exposed on a side surface of the concave portion 102 and an outer upper surface of the concave portion 102. The conductive film 100 is formed of, for example, a metal film, and the metal film is formed of, for example, tungsten (W). The insulating film 101 is formed of, for example, a silicon oxide (SiO).

(Pressure Adjustment and Temperature Adjustment)

The interior of the process chamber 201 (i.e., the space in which the wafer 200 exists) is evacuated (or depressurized) by the vacuum pump 264 to reach a desired pressure (vacuum level). The term "depressurized" means that the interior of the process chamber 201 is evacuated to reach a pressure lower than an atmospheric pressure. At this time, the internal pressure of the process chamber 201 is measured by the pressure sensor 265, and the APC valve 262 is feedback-controlled based on the measured pressure information. The vacuum pump 264 is always kept in an operative state at least until a process on the wafer 200 is terminated.

Further, the wafer 200 within the process chamber 201 is heated by the heater 206 to a predetermined process temperature. At this time, a condition of current applying to the heater 206 is feedback-controlled based on the temperature information detected by the temperature sensor 206b in order to keep a desired temperature distribution in the surface of the wafer 200. Such heating of the wafer 200 by the heater 206 is continuously performed at least until a process on the wafer 200 is terminated.

(Preliminary Vaporization of Each Precursor)

In parallel with the process of substrate loading and temperature adjustment, each of an Sb precursor gas (first precursor gas), a Te precursor gas (second precursor gas), and a Ge precursor gas (third precursor gas) is produced in the following manner (preliminary vaporization).

The valves va1, va2, and va5 are opened and a carrier gas supplied from the carrier gas supply pipe 237a and controlled in a flow rate by the MFC 222a is supplied into the bubbler 220a to vaporize an Sb liquid precursor accommodated within the bubbler 220a through bubbling to produce an Sb precursor gas.

Further, the valves vb1, vb2, and vb5 are opened and a carrier gas supplied from the carrier gas supply pipe 237b and controlled in a flow rate by the MFC 222b is supplied into the bubbler 220b to vaporize a Te liquid precursor accommodated within the bubbler 220b through bubbling to produce a Te precursor gas.

Also, the valves vc1, vc2, and vc5 are opened and a carrier gas supplied from the carrier gas supply pipe 237c and controlled in a flow rate by the MFC 222c is supplied into the bubbler 220c to vaporize a Ge liquid precursor accommodated within the bubbler 220c through bubbling to produce a Ge precursor gas.

During the process of preliminary vaporization, while the vacuum pump 264 is operated, in a state where the valves va3, vb3, and vc3 are closed, the valves va4, vb4, and vc4 are opened to allow a precursor gas to bypass the process chamber 201, without being supplied into the process chamber 201, so as to be exhausted. In order to stably produce a precursor gas with the bubblers 220a, 220b, and 220c, a predetermined period of time is required. Thus, in this embodiment, the precursor gas is produced in advance and opening/closing of the valves va3, vb3, and vc3 and the valves va4, vb4, and vc4 is changed to switch a flow path of the precursor gas. As a result, a stable supply of the precursor gas into the process chamber 201 may be rapidly started or stopped through switching of the valves.

Further, during the processes of substrate loading and temperature adjustment and substrate unloading described later, while the vacuum pump 264 is operated, the valves va3, vb3, vc3, and vd3 are closed and the valves ve1, ve2, ve3, vf1, vf2, and vf3 are opened to allow a N₂ gas to constantly flow into the process chamber 201. Accordingly, attachment of particles to the wafer 200 may be suppressed.

(Growth of First Layer)

After the process of substrate loading and temperature adjustment, step 1a described below is executed as a process of growing a first layer.

[Step 1a]

(Supply of Sb Precursor Gas and Te Precursor Gas)

The valves va4 and vb4 are simultaneously closed and the valves va3 and vb3 are simultaneously opened to simultaneously start the supply of the Sb precursor gas and the Te precursor gas into the process chamber 201.

The Sb precursor gas and the Te precursor gas supplied from the precursor gas supply port 210a to an upper portion of the shower head 240 enter the second buffer space 240d from the plurality of vent holes of the dispersing plate 240a through the first buffer space (distribution chamber) 240c, and are also supplied into the process chamber 201 through the plurality of vent holes of the shower plate 240b so as to be supplied to the heated wafer 200.

Further, when the Sb precursor gas and the Tb precursor gas are supplied into the process chamber 201, the valves ve1, ve2, ve3, vf1, vf2, and vf3 may be left open to allow the N₂ gas to continuously flow into the process chamber 201, so that spreading of the Sb precursor gas and the Te precursor gas is promoted within the process chamber 201.

The supply of the Sb precursor gas and the Te precursor gas into the process chamber 201 is maintained for a predetermined period of time to grow an SbTe layer having a predetermined thickness and containing Sb and Te, as a first layer on the wafer 200.

Figure 6B:
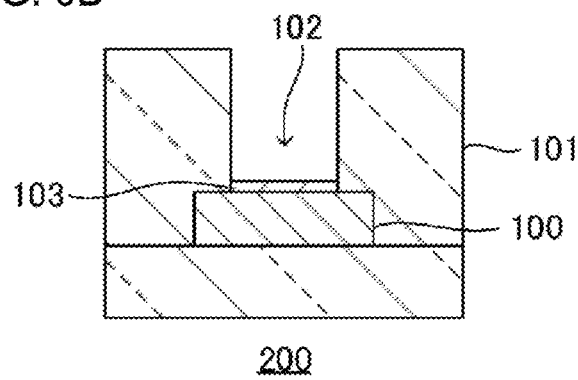

As illustrated in FIG. 6B, during the process of growing the SbTe layer performed for the first time, the SbTe layer is not grown on the insulating film 101 and the SbTe layer 103 is selectively grown on the conductive film 100. More specifically, the SbTe layer 103 is selectively grown on the lower surface of the concave portion 102, namely, on the conductive film 100, without being grown on the side surface of the concave portion 102. During the process of growing the SbTe layer performed for the first time, the Sb precursor and the Te precursor are supplied to both of the conductive film 100 and the insulating film 101 exposed on the surface of the initial wafer 200, but in this respect, the inventors of this application discovered that the SbTe layer was grown on the conductive film 100 but not on the insulating film 101. That is, during the process of growing the SbTe layer performed for the first time, the SbTe layer may be selectively grown on the conductive film 100.

Figure 6D:
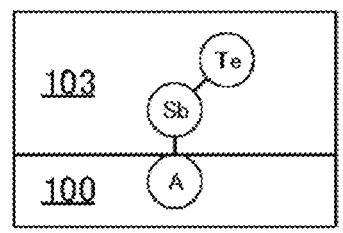
FIG. 6D is a conceptual view hypothetically illustrating a mechanism of a selective growth of an SbTe layer on a conductive film.

A hypothesis of a mechanism of a selective growth of the SbTe layer on the conductive film 100 will be described with reference to FIG. 6D. First, an atom constituting the conductive film 100, for example, a metal atom (indicated by A) such as a W atom and an Sb atom (indicated by Sb) contained in the Sb precursor are bonded based on the exchange of electrons. Then, the Sb atom bonded to the atom constituting the conductive film 100 and a Te atom (indicated by Te) contained in the Te precursor are bonded. Meanwhile, an atom constituting the insulating film 101 and the Sb atom and the Te atom are not bonded because electrons are not exchanged therebetween. In this manner, it is considered that, since the Sb atom is selectively bonded to the atom constituting the conductive film 100, the SbTe layer is selectively grown on the conductive film 100.

It is considered that the Sb atom is bonded even to a semi-metal atom or a semiconductor atom, without being limited to a metal atom, through the exchange of electrons. Thus, the conductive film 100 serving as a base of the selective growth of SbTe may be recognized as the conductive film 100 containing a metal element, a semi-metal element, or a semiconductor element.

A material of the conductive film 100 containing a metal element may be, for example, cobalt (Co), manganese (Mn), platinum (Pt), copper (Cu), titanium nitride (TiN), tantalum nitride (TaN), hafnium nitride (HfN), zirconium nitride (ZrN), tungsten nitride (WN), tungsten oxide (WO), or the like, in addition to W. More specifically, the conductive film 100 is a metal film in which at least the exposed surface portion is formed of only a metal element (excluding an impurity), for example, a metal-alone film.

Further, a material of the conductive film 100 containing a semi-metal element or a semiconductor element may be Ge, Si, or the like. In addition, a GeTe layer grown as a second layer described later also serves as a base of the selective growth of the SbTe layer grown during a process of growing the SbTe layer performed second time and thereafter.

A material of the insulating film 101 may be, for example, silicon nitride (SiN), silicon oxynitride (SiON), or the like, in addition to SiO. The insulating film 101 may be formed by laminating a plurality of layers, or may be an insulating film in which a plurality of layers is exposed on a side surface of the concave portion 102. Further, it is permitted for a conductive layer to exist in the laminated insulating film. However, this conductive layer may have a thickness of 10 nm or less. When the conductive layer is so thin as to have the thickness of 10 nm or less, the SbTe layer may be suppressed from being grown on the corresponding conductive layer exposed on the side surface of the concave portion 102.

A thickness of the SbTe layer may be controlled by adjusting a time (gas supply time) during which the Sb precursor gas and the Te precursor gas are supplied to the wafer 200. A ratio of Sb and Te in the SbTe layer may be controlled by adjusting a ratio of a flow rate of the Sb precursor gas and a flow rate of the Te precursor gas. For example, Sb:Te=2:3. That is, as the SbTe layer, an $Sb_2Te_3$ layer may be formed.

(Residual Gas Removal)

After the SbTe layer having a predetermined thickness is grown, the valves va3 and vb3 are closed and the valves va4 and vb4 are opened to stop the supply of the Sb precursor gas and the Te precursor gas into the process chamber 201. At this time, while the APC valve 262 of the exhaust pipe 261 is opened, the interior of the process chamber 201 is evacuated by the vacuum pump 264, and an unreacted Sb precursor gas and a Te precursor gas remaining in the process chamber 201 or an Sb precursor gas and a Te precursor gas after growing the SbTe layer is removed from the process chamber 201. At this time, while the valves ve1, ve2, ve3, vf1, vf2, and vf3 are opened, the supply of the $N_2$ gas as an inert gas into the process chamber 201 is maintained. The $N_2$ gas acts as a purge gas, and thus, an unreacted Sb precursor gas and a Te precursor gas remaining in the process chamber 201 or an Sb precursor gas and a Te precursor gas after growing the SbTe layer can be effectively removed from the process chamber 201

Also, at this time, the residual gas remaining in the process chamber 201 may not be completely removed or the interior of the process chamber 201 may not be completely purged. When the residual gas remaining in the process chamber 201 is very small in amount, there may be no harmful effect at a subsequent Step 2a. Here, a flow rate of the $N_2$ gas supplied into the process chamber 201 needs not be high. For example, if approximately the same amount of the $N_2$ gas as the volume of the process vessel 202 (process chamber 201) is supplied, the purging process can be performed without a harmful effect at Step 2. As described above, since the interior of the process chamber 201 is not completely purged, the purge time can be reduced and the throughput can be improved. In addition, the consumption of the $N_2$ gas can be restricted to a required minimal amount.

The process conditions of the wafer 200 at Step 1a may be exemplified as follows.

Wafer temperature: 225 to 350 degrees C.
Internal pressure of process chamber: 50 Pa to 400 Pa
Flow rate of Sb precursor gas: 0.1 sccm to 100 sccm
Flow rate of Te precursor gas: 0.1 sccm to 100 sccm
Flow rate of $N_2$: 0 sccm to 2,000 sccm
Supply time of Sb precursor gas: 1 to 120 seconds, specifically, 1 to 60 seconds
Supply time of Te precursor gas: 1 to 120 seconds, specifically, 1 to 60 seconds
Supply time of $N_2$ gas (purge time): 1 to 120 seconds, specifically, 1 to 60 seconds
Thickness of SbTe layer: 1 to 100 nm.

(Growth of Second Layer)

After Step 1a, which is the process of growing the first layer, is executed, Step 2a described below is executed as a process of growing a second layer.

[Step 2a]

(Supply of Te Precursor Gas and Ge Precursor Gas)

The valves vb4 and vc4 are simultaneously closed and the valves vb3 and vc3 are simultaneously opened to simultaneously start the supply of the Te precursor gas and the Ge precursor gas into the process chamber 201. Each of the Te precursor gas and the Ge precursor gas is supplied into the process chamber 201 through the shower head 240, like the gas supply at Step 1a, so as to be supplied to the heated wafer 200.

Further, the valves ve1, ve2, ve3, vf1, vf2, and vf3 are left open to allow the $N_2$ gas to constantly flow into the process chamber 201, so that spreading of the Te precursor gas and the Ge precursor gas is promoted, like Step 1a.

The supply of the Te precursor gas and the Ge precursor gas into the process chamber 201 is maintained for a predetermined period of time to grow a GeTe layer having a predetermined thickness and containing Ge and Te, as a second layer on the wafer 200.

Figure 6C:
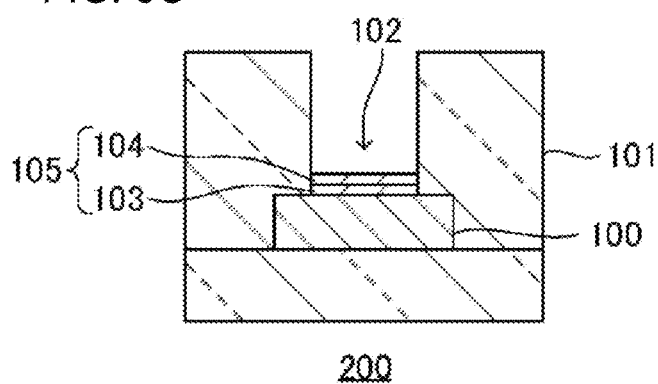

As illustrated in FIG. 6C, during the process of growing the GeTe layer performed for the first time, the GeTe layer is not grown on the insulating film 101 and the GeTe layer 104 is selectively grown on the SbTe layer 103. More specifically, the GeTe layer 104 is selectively grown on the SbTe layer 103 which has been grown on the lower surface of the concave portion 102, without being grown on the side surface of the concave portion 102. During the process of growing the GeTe layer, the Ge precursor and the Te precursor are supplied to both of the SbTe layer and the insulating film 101, but in this respect, the inventors of this application discovered that the GeTe layer was grown on the SbTe layer but not on the insulating film 101. That is, during the process of growing the GeTe layer performed for the first time, the GeTe layer may be selectively grown on the SbTe layer. Further, the SbTe layer also serves as a base of the selective growth of the GebTe layer, even in a process of growing the GeTe layer performed second time and thereafter.

A thickness of the GeTe layer may be controlled by adjusting a time (gas supply time) during which the Te precursor gas and the Ge precursor gas are supplied to the wafer 200. A ratio of Ge and Te in the GeTe layer may be controlled by adjusting a ratio of a flow rate of the Ge precursor gas and a flow rate of the Te precursor gas. For example, Ge:Te=1:1.

(Residual Gas Removal)

After the GeTe layer having a predetermined thickness is grown, the valves vb3 and vc3 are closed and the valves vb4 and vc4 are opened to stop the supply of the Te precursor gas and the Ge precursor gas into the process chamber 201. At this time, while the APC valve 262 of the exhaust pipe 261 is opened, the interior of the process chamber 201 is evacuated by the vacuum pump 264, and an unreacted Te precursor gas and a Ge precursor gas remaining in the process chamber 201 or a Te precursor gas and a Ge precursor gas after growing the GeTe layer is removed from the process chamber 201. At this time, while the valves ve1, ve2, ve3, vf1, vf2, and vf3 are opened, the supply of the $N_2$ gas into the process chamber 201 is maintained, and the residual gas remaining in the process chamber 201 may not be completely removed and the interior of the process chamber 201 may not be completely purged, like the residual gas removing process at Step 1a.

The process conditions of the wafer 200 at Step 2a may be exemplified as follows.

Wafer temperature: 225 to 350 degrees C.
Internal pressure of process chamber: 50 Pa to 400 Pa
Flow rate of Te precursor gas: 0.1 sccm to 100 sccm
Flow rate of Ge precursor gas: 0.1 sccm to 100 sccm
Flow rate of $N_2$: 0 sccm to 2,000 sccm
Supply time of Te precursor gas: 1 to 120 seconds, specifically, 1 to 60 seconds
Supply time of Ge precursor gas: 1 to 120 seconds, specifically, 1 to 60 seconds
Supply time of $N_2$ gas (purge time): 1 to 120 seconds, specifically, 1 to 60 seconds
Thickness of GeTe layer: 1 to 100 nm.

Also, at each of Step 1a and Step 2a, as the inert gas, a rare gas such as an Ar gas, an He gas, a Ne gas, or a Xe gas, in addition to the $N_2$, gas may be used.

(Performing Cycle Predetermined Number of Times)

Step 1a, namely, the process of growing the SbTe layer as the first layer, and Step 2a, namely, the process of growing the GeTe layer as the second layer, are set to 1 cycle, and this cycle is performed a predetermined number of times (once or more), namely, the process of growing the SbTe layer and the process of growing the GeTe layer are alternatively performed one or more times to grow a laminated film 105 formed by selectively laminating the SbTe layer and the GeTe layer on the conductive film 100. More specifically, the laminated film 105 is selectively grown on a lower surface of the concave portion 102, without being grown on the side surface of the concave portion 102.

Figure 7A:
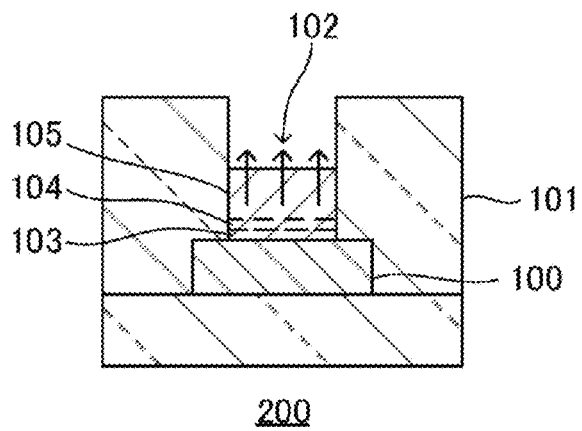
FIGS. 7A to 7C are cross-sectional views schematically illustrating a substrate processing process of an embodiment of the present disclosure.

The growth of the laminated film 105 after the second cycle in a case in which the cycle is performed a plurality number of times will be described with reference to FIGS. 7A and 7B. At Step 1a after the second cycle, that is, during the process of growing the SbTe layer performed after the second time, an SbTe layer is not grown on the insulating film 101 and is selectively grown on the GeTe layer. At step 2a after the second cycle, that is, during a process of growing a GeTe layer performed after the second time, a GeTe layer is not grown on the insulating film 101 and is selectively grown on the SbTe layer. More specifically, during the process of growing the SbTe layer performed after the second time, the SbTe layer is not grown on the side surface of the concave portion 102 and is selectively grown on the GeTe layer which has been grown on an upper portion of the lower surface of the concave portion 102. During a process of growing the GeTe layer performed after the second time, a GeTe layer is not grown on the side surface of the concave portion 102 and is selectively grown on the SbTe layer which has been grown on an upper portion of the lower surface of the concave portion 102.

In this manner, the laminated film 105 may be grown from the lower surface of the concave portion 102 in a bottom-up manner, rather than being grown from the side surface of the concave portion 102. Such a film formation is also called a bottom-up film formation. In FIG. 7A, a growth direction of the laminated film 105 is indicated by the arrows. Also, in the drawings following FIG. 7A, each of the SbTe layer and the GeTe layer grown on the upper portions of the SbTe layer 103 grown during the first SbTe layer growth process and the GeTe layer 104 grown during the first GeTe layer growth process is not illustrated in order to avoid complication.

Figure 7B:
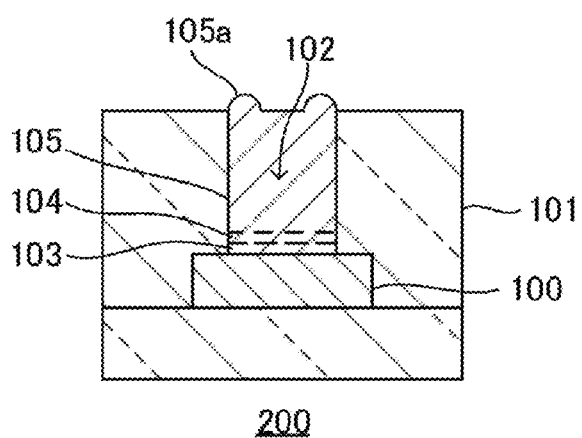

As illustrated in FIG. 7B, when a thickness of the laminated film 105 reaches a predetermined thickness and burying of the concave portion 102 is completed, the growth of the laminated film 105 is terminated. In addition, a final Step may be Step 1a or Step 2a as necessary. That is, the uppermost surface of the grown laminated film 105 may be the SbTe layer or the GeTe layer as necessary. An upper surface of the grown laminated film 105 has a protrusion 105a, which protrudes relative to an upper surface of the insulating film 101 at an outside of the concave portion, which has a circular ring shape along the edges of an opening of the concave portion 102.

Further, the laminated film 105 may be grown as a laminated film (nano-laminate film) formed by laminating the SbTe layer and the GeTe layer at a nano scale, as a superlattice, as necessary. When the laminated film 105 is grown as a superlattice, a thickness of each SbTe layer may be within a range of 1 to 4 nm, and also, specifically, a thickness of each GeTe layer may be within a range of 1 to 2 nm.

(Purge)

After the laminated film having a predetermined film thickness is gown, while the valve 262 of the exhaust pipe 261 is opened, the interior of the process chamber 201 is evacuated by the vacuum pump 264 and the residual gas remaining in the process chamber 201 and reaction by-products are removed from the process chamber 201. Further, at this time, while the valves ve1, ve2, ve3, vf1, vf2, and vf3 are opened, the supply of the $N_2$ gas as an inert gas into the process chamber 201 is maintained. The $N_2$ gas acts as a purge gas, and thus, the residual gas remaining in the process chamber 201 and reaction by-products can be effectively removed from the process chamber 201.

(Substrate Unloading)

Thereafter, the wafer 200 after the growth of the laminated film is unloaded from the process chamber 201 to the negative pressure transfer chamber 11 in reverse order of the order illustrated in the substrate loading process and the substrate mounting process described above.

Thereafter, the wafer 200 after the process is maintained in a storage chamber adjacent to the negative pressure transfer chamber 11 until a temperature of the wafer 200 reaches room temperature. Further, in order to restrain oxidation of the grown laminated film, an internal atmosphere of the negative pressure transfer chamber 11 or of the storage chamber is a pressure atmosphere lower than an atmospheric pressure, for example, and also, is an atmosphere of an inert gas such as a $N_2$ gas, and a partial pressure of an oxygen ($O_2$) gas is lowered.

(Substrate Polishing)

Figure 7C:
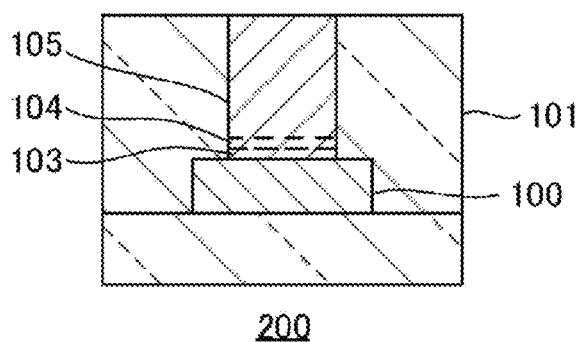

Thereafter, as illustrated in FIG. 7C, an upper surface of the laminated film 105 may be chemical mechanical polishing (CMP)-processed with a CMP device to remove the protrusion 105a. That is, the upper surface of the laminated film 105 may be planarized through the CMT process.

(3) Effects of the Embodiment

According to this embodiment, one or more effects are provided as described below.

(a) When the laminated film formed as an SbTe layer and a GeTe layer are laminated is grown on a substrate in which a conductive film containing a metal element, a semi-metal element, or a semiconductor element, and an insulating film are exposed on a surface thereof, the process of growing the SbTe layer can be performed before the process of growing the GeTe layer, thereby selectively growing the laminated film on the conductive film.

During a process of growing the SbTe layer performed for the first time, the SbTe layer can be selectively grown on the conductive film. During a process of growing the GeTe layer performed for the first time, the GeTe layer can be selectively grown on the SbTe layer. During a process of growing the SbTe layer performed second time and thereafter, the SbTe layer can be selectively grown on the GeTe layer. During a process of growing the GeTe layer performed after the second time, the GeTe layer can be selectively grown on the SbTe layer, like the process of growing the GeTe layer performed for the first time.

(b) For example, since an Sb precursor containing at least any one of an alkyl group and an amino group is used as an Sb precursor, a Te precursor containing an alkyl group is used as a Te precursor, and a Ge precursor containing at least one of an amino group and an amidine group is used as a Ge precursor, the laminated film can be selectively grown on the conductive film.

(c) In a case in which the substrate in which the concave portion is formed on a surface thereof, the conductive film is exposed on a lower surface of the concave portion, and the insulating layer is exposed on a side surface of the concave portion is used, the laminated film can be selectively grown on the lower surface of the concave portion. That is, the laminated film can be grown from the lower surface of the concave portion in a bottom-up manner.

Figure 11:
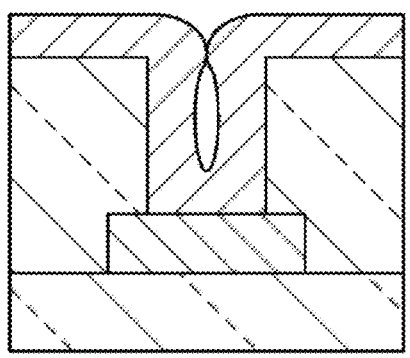
FIG. 11 is a cross-sectional view schematically illustrating a laminated film according to a comparative example.

Here, as a comparative example, a case in which a laminated film is non-selectively grown along the shape of the surface of the substrate in which the concave portion is formed on a surface thereof, namely, in the entire region along a lower surface of the concave portion, a side surface of the concave portion, and an upper surface at an outside of the concave portion, that is, a case in which a laminated film is conformally grown, will be described with reference to FIG. 11.

In the conformal growth of the comparative example, a shoulder portion grown to protrude toward the center of the concave portion from the vicinity of the edge of the concave portion is in contact with a shoulder portion of the opposite side, forming a void within the concave portion, which results in that the concave portion may not be properly buried. Further, in the conformal growth, for example, a laminating direction of the laminated film may not be aligned in the lower surface of the concave portion and in the side surface of the concave portion. In addition, in the conformal growth, after the growth of the laminated film burying the concave portion is terminated, the entire surface at the outside of the concave portion needs to be removed through CMP, and thus, the CMP process is not easy.

In contrast, in the bottom-up growth according to an embodiment of the present disclosure, since a growth direction of the laminated film is aligned upwardly, formation of a void is prevented, and thus, the concave portion can be properly buried. Further, a laminating direction of the laminated film may be uniformly aligned. In addition, CMP can be performed to merely remove the protrusion 105a, and since CMP is not necessary for the outer side of the concave portion, the CMP process is facilitated and time for the CMP can be shortened.

(d) Since the thickness of each SbTe layer is within a range of 1 to 4 nm and the thickness of each GeTe layer is within a range of 1 to 2 nm, the laminated film can be grown as a superlattice (nano-laminate film).

(e) During the process of growing the SbTe layer, the SbTe layer having, for example, Sb:Te=2:3 can be grown by adjusting the ratio of a flow rate of the Sb precursor gas and that of the Te precursor gas. Further, during the process of growing the GeTe layer, the GeTe layer having, for example, Ge:Te=1:1 can be grown by adjusting the ratio of a flow rate of the Ge precursor gas and that of the Te precursor gas. In this manner, the laminated film in which Sb:Te in the SbTe layer and Ge:Te in the GeTe layer have been controlled, for example, the laminated film formed by laminating the SbTe layer having Sb:Te=2:3 and the GeTe layer having Ge:Te=1:1 can be grown.

(4) Modifications

The film forming sequence in this embodiment is not limited to the form illustrated in FIG. 5 but may be altered as the following modifications.

(Modification 1)

Modification 1 will be described. Modification 1 is different from the film forming sequence illustrated in FIG. 5, at that Step 1b of supplying a reaction gas after Step 1a is added, during the process of growing the SbTe layer as a first layer. In addition, Modification 1 is different from the film forming sequence illustrated in FIG. 5, at that Step 2b of supplying a reaction gas after Step 2a is added, during the process of growing the GeTe layer as a second layer.

(Growth of First Layer)

[Step 1a]

First, like the process described with respect to the film forming sequence illustrated in FIG. 5, a process is performed up to Step 1a of the process of growing the SbTe layer.

[Step 1b]

(Supply of $NH_3$ Gas)

After the residual gas removing process of Step 1a is terminated, the valves vd1, vd2, and vd3 are opened to start the supply of a $NH_3$ gas as a reaction gas into the process chamber 201. The $NH_3$ gas supplied from the reaction gas supply port 210b is supplied into the process chamber 201 from the lower side of the shower plate 240b, namely, without passing through the shower head 240, so as to be supplied to the heated wafer 200. Further, when the $NH_3$ gas is supplied into the process chamber 201, the valves ve1, ve2, ve3, vf1, vf2, and vf3 may be left open to allow a $N_2$ gas to constantly flow into the process chamber in order to promote spreading of the $NH_3$ gas within the process chamber 201.

Accordingly, the $NH_3$ gas is supplied to the SbTe layer formed at Step 1a. Due to a catalytic action of the $NH_3$ gas, separation of residual legands contained in the SbTe layer from the SbTe layer may be promoted. In this manner, an impurity concentration of the SbTe layer may be reduced.

(Residual Gas Removal)

Thereafter, the valve vd3 is closed to stop the supply of the $NH_3$ gas into the process chamber 201. At this time, while the APC valve 262 of the exhaust pipe 261 is opened, the interior of the process chamber 201 is evacuated by the vacuum pump 264, and an unreacted $NH_3$ gas remaining in the process chamber 201 or a $NH_3$ gas after removing the residual legands from the SbTe layer, and reaction by-products, are removed from the process chamber 201.

In addition, at this time, while the valves ve1, ve2, ve3, vf1, vf2, and vf3 are opened, the supply of the $N_2$ gas into the process chamber 201 is maintained, the residual gas remaining in the process chamber 201 may not be completely removed, and the interior of the process chamber 201 may not be completely purged, like the residual gas removing process of Step 1a.

The process conditions of the wafer 200 at step 1b may be exemplified as follows.

Wafer temperature: 225 to 350 degrees C.
Internal pressure of process chamber: 50 Pa to 400 Pa
Flow rate of $NH_3$: 50 sccm to 1,000 sccm
Flow rate of $N_2$: 0 sccm to 2,000 sccm
Supply time of $NH_3$ gas: 1 to 120 seconds, specifically, 1 to 60 seconds
Supply time of $N_2$ gas (purge time): 1 to 120 seconds, specifically, 1 to 60 seconds.

(Growth of Second Layer)

[Step 2a]

After the residual gas removing process of Step 1b is terminated, like the process described with respect to the film forming sequence illustrated in FIG. 5, a process is performed up to Step 2a of a process of growing the GeTe layer.

[Step 2b]

(Supply of $NH_3$ gas)

After the residual gas removing process of Step 2a is terminated, like the $NH_3$ gas supply process of Step 1b, the supply of a $NH_3$ gas is started. Further, like the $NH_3$ gas supply process of Step 1b, a $N_2$ gas may be allowed to constantly flow into the process chamber.

Accordingly, the $NH_3$ gas is supplied to the GeTe layer formed at Step 2a. Due to a catalytic action of the $NH_3$ gas, separation of residual legands contained in the GeTe layer from the GeTe layer may be promoted. In this manner, an impurity concentration of the GeTe layer may be reduced.

(Residual Gas Removal)

Thereafter, like the residual gas removing process of Step 1b, the supply of the $NH_3$ gas into the process chamber 201 is stopped. At this time, while the APC valve 262 of the exhaust pipe 261 is opened, the interior of the process chamber 201 is evacuated by the vacuum pump 264, and an unreacted $NH_3$ gas remaining in the process chamber 201 or a $NH_3$ gas after removing the residual legands from the GeTe layer, and reaction by-products, are removed from the process chamber 201.

In addition, at this time, the supply of the $N_2$ gas into the process chamber 201 is maintained, the residual gas remaining in the process chamber 201 may not be completely removed, and the interior of the process chamber 201 may not be completely purged, like the residual gas removing process of Step 1b.

The process conditions of the wafer 200 at step 2b may be exemplified as follows.

Wafer temperature: 225 to 350 degrees C.
Internal pressure of process chamber: 50 Pa to 400 Pa
Flow rate of $NH_3$: 50 sccm to 1,000 sccm
Flow rate of $N_2$: 0 sccm to 2,000 sccm
Supply time of $NH_3$ gas: 1 to 120 seconds, specifically, 1 to 60 seconds
Supply time of $N_2$ gas (purge time): 1 to 120 seconds, specifically, 1 to 60 seconds.

Step 1a and Step 1b, namely, the process of growing the SbTe layer as the first layer, and Step 2a and Step 2b, namely, the process of growing the GeTe layer as the second layer, are set to 1 cycle, and this cycle is performed a predetermined number of times (once or more) to grow a laminated film formed by laminating the SbTe layer and the GeTe layer. Further, thereafter, a purging process, a substrate unloading process, and a substrate polishing process are performed in the same manner as that of the process described with respect to the film forming sequence illustrated in FIG. 5.

(Modification 2)

Modification 2 will be described. Modification 2 is different from the film forming sequence illustrated in FIG. 5, in that a reaction gas, for example, a $NH_3$ gas is supplied. In Step 1a of growing an SbTe layer, the $NH_3$ gas is simultaneously supplied with an Sb precursor gas and a Te precursor gas, and in Step 2a of growing a GeTe layer, the $NH_3$ gas is simultaneously supplied with the Te precursor gas and a Ge precursor gas. A flow rate of the $NH_3$ gas in Step 1a and Step 2a may be, for example, 50 sccm to 1,000 sccm.

The $NH_3$ gas acts as a catalyst that promotes thermal decomposition of the Sb precursor gas, the Te precursor gas, and the like during the process of growing the SbTe layer, and acts as a catalyst that promotes thermal decomposition of the Te precursor gas and the Ge precursor gas during the process of growing the GeTe layer. Accordingly, the growth of the SbTe layer may be more effectively performed and the growth of the GeTe layer may be more effectively performed.

In Modification 1, the precursor gas and the reaction gas are alternately supplied, but like Modification 2, the precursor gas and the reaction gas may be simultaneously supplied. Also, in the substrate processing apparatus according to this embodiment, the precursor gas and the reaction gas may be separately supplied into the process chamber 201. Thus, when the precursor gas and the reaction gas are simultaneously supplied may be suppressed, the precursor gas and the reaction gas may be restrained from being reacted with each other before they are supplied into the process chamber 201.

The reaction gas used in each of Modifications 1 and 2 is not limited to the $NH_3$ gas. As the reaction gas, a reduction gas, i.e., a hydrogen-containing gas, such as, e.g., a hydrazine ($N_2H_4$) gas, a diagen ($N_2H_2$) gas, a $N_3H_8$ gas, or a hydrogen ($H_2$) gas, in addition to the $NH_3$ gas, may also be used.

According to Modifications 1 and 2, the same effects as those of the film forming sequence illustrated in FIG. 5 may be obtained. In each of Modifications 1 and 2, other process conditions than those described as differences from the film forming sequence of FIG. 5 may be the same process conditions as those described with respect to the film forming sequence of FIG. 5, for example.

Other Embodiments of the Present Disclosure

The embodiments of the present disclosure have been described in detail above. However, the present disclosure is not limited to the foregoing embodiments but may be variously modified without departing from the spirit of the present disclosure.

An example in which one precursor gas supply port 210a and one reaction gas supply port 210b are formed has been described in the substrate processing apparatus according to the above-described embodiment, but a plurality of precursor gas supply ports 210a and a plurality of reaction gas supply ports 210b may be formed. By forming a plurality of precursor gas supply ports 210a for each of types of precursor gases, a plurality of types of precursor gases may be easily restrained from being mixed and reacted within the precursor gas supply ports 210a, and thus, generation of particles within the process chamber 201 may be suppressed or cleaning frequency of the precursor gas supply ports 210a may be reduced. By forming a plurality of precursor gas supply ports 210a in a distributed manner, a reaction gas may be evenly spread within the process chamber 201, and thus, in-plane uniformity of a reaction by the reaction gas may be enhanced.

The process recipe for use in growing the laminated film (program in which procedures, process conditions, and the like are described) may be individually prepared (a plurality of things are prepared) based on contents of the substrate processing (a composition ratio of each layer, a film quality, a film thickness, gas supply patterns, process conditions, and the like). Further, when a substrate processing is initiated, a suitable process recipe may be appropriately selected among a plurality of process recipes based on contents of the substrate processing. Specifically, the plurality of process recipes individually prepared based on contents of the substrate processing may be previously stored (installed) in the memory device 280c provided in the substrate processing apparatus via an electrical communication line or a recording medium (e.g., the external memory device 282) in which the corresponding process recipes are recorded. In addition, when the substrate processing is initiated, the CPU 280a provided in the substrate processing apparatus may appropriately select a suitable process recipe among the plurality of process recipes stored in the memory device 280c based on contents of the substrate processing. With this configuration, laminated films having a variety of composition ratios, film qualities, and film thicknesses can be grown with high versatility and high reproducibility in one substrate processing apparatus. In addition, since an operator's work load (a load of inputting procedures or process conditions, or the like) can be lessened, it is possible to rapidly initiate the substrate processing while avoiding an operational error.

The above-described process recipe is not limited to a newly prepared recipe and may be prepared, for example, by modifying an existing process recipe that is already installed on the substrate processing apparatus. When the process recipe is modified, the process recipe after the modification recipe may be installed on the existing substrate processing apparatus via an electrical communication line or a recording medium in which the process recipe is recorded. In addition, the existing process recipe that is already installed on the substrate processing apparatus may be directly changed by manipulating the input/output device 281 of the existing substrate processing apparatus.

In the above-described embodiment, an example of performing a substrate processing using a single-wafer type substrate processing apparatus (a single-wafer type apparatus) in which one or several substrates is processed at a time has been described. The present disclosure is not limited thereto but may be appropriately applied to, for example, a case in which a batch-type vertical substrate processing apparatus (vertical apparatus) which processes a plurality of substrates at a time is used to perform a substrate processing. In addition, in the above-described embodiment, an example of performing a substrate processing using a substrate processing apparatus having a cold wall type processing furnace has been described. The present disclosure is not limited thereto but may be appropriately applied to a case in which a substrate processing apparatus having a hot wall type processing furnace is used to perform a substrate processing. Even in these cases, the process conditions may be the same as those in the above-described embodiment, for example.

Hereinafter, an example of a substrate processing using a hot wall type vertical apparatus will be described with reference to FIGS. 10A and 10B.

Figure 10A:
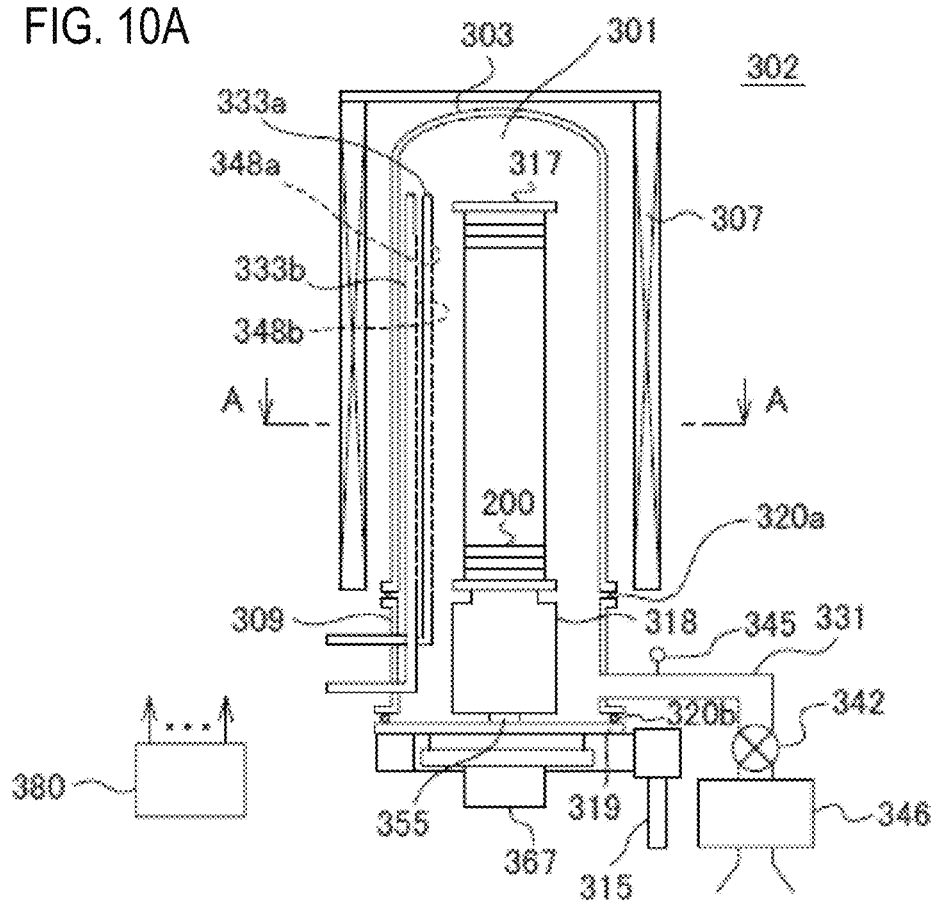
FIG. 10A is a longitudinal sectional view illustrating an example of a schematic structure of a batch-type substrate processing apparatus.
Figure 10B:
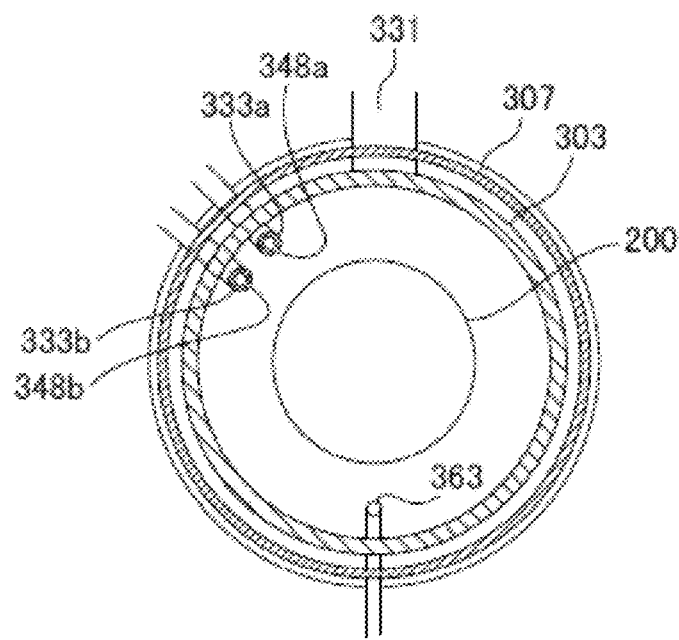
FIG. 10B is a cross-sectional view taken along line A-A of FIG. 10A, which illustrates an example of a schematic structure of a batch-type substrate processing apparatus.

As illustrated in FIG. 10A, a processing furnace 302 has a heater 307 as a heating part (heating mechanism). The heater 307 has a cylindrical shape and is supported by a heater base (not shown) as a support plate so as to be vertically installed.

A reaction tube 303 is disposed inside the heater 307 in a concentric form along the heater 307. The reaction tube 303 is made of a heat resistant material such as, e.g., quartz ($SiO_2$) or silicon carbide (SiC), and has a cylindrical shape with its upper end closed and its lower end opened. A process chamber 301 is defined in a hollow cylindrical portion of the reaction tube 303. The process chamber 301 is configured to accommodate wafers 200 as a plurality of substrates, in a state where horizontally-positioned wafers 200 are vertically aligned in multiple stages in a boat 317 described later.

A manifold 309 is disposed under the reaction tube 303 in concentric form along the reaction tube 303. The manifold 309 is made of, e.g., stainless or the like, and has a cylindrical shape with its upper end and its lower end opened. The manifold 309 is installed in a locking manner to support the reaction tube 303. Further, an O-ring 320a is installed as a seal member between the manifold 309 and the reaction tube 303. As the manifold 309 is supported by a heater base, the reaction tube 303 is vertically installed. A process vessel (or reaction vessel) is configured by the reaction tube 303 and the manifold 309.

A first nozzle 333a as a first gas introduction part and a second nozzle 333b as a second gas introduction part are connected to the manifold 309 to extend through a sidewall of the manifold 309. Each of the first nozzle 333a and the second nozzle 333b is formed of a heat resistant material such as, e.g., quartz or SiC, and has an L shape having a horizontal portion and a vertical portion. The horizontal portion is connected to the manifold 309. The vertical portion is installed to be lifted toward a loading direction of the wafer 200 from a lower portion to an upper portion of an inner wall of the reaction tube 303 in a space having a circular ring shape between the inner wall of the reaction tube 303 and the wafer 200. A first gas supply hole 348a and a second gas supply hole 348b, which are supply holes for supplying a gas are formed on side surfaces of the vertical portions of the first nozzle 333a and the second nozzle 333b, respectively. Each of the first gas supply hole 348a and the second gas supply hole 348b is formed to have the same opening area and at the same opening pitch across the upper portion from the lower portion, for example.

A gas supply system which is connected to the first nozzle 333a and the second nozzle 333b is the same as that of the above-described embodiment. However, this embodiment is different from the above-described embodiment, in that the precursor gas supply system is connected to the first nozzle 333a and the reaction gas supply system is connected to the second nozzle 333b.

That is, in this embodiment, a precursor gas and a reaction gas are supplied through separate nozzles.

Further, the precursor gas and the reaction gas may be supplied through the same nozzle.

An exhaust pipe 331 for exhausting an internal atmosphere of the process chamber 201 is installed at the manifold 309. A vacuum pump 246 as a vacuum exhaust device is connected to the exhaust pipe 331 through a pressure sensor 345, which is a pressure detector, and an APC valve 342, which is a pressure adjuster. The APC valve 342 is configured to perform/stop vacuum exhaust in the process chamber 301 by opening/closing the valve with the actuated vacuum pump 346, and further to adjust the internal pressure of the process chamber 301 by adjusting a degree of the valve opening based on pressure information detected by the pressure sensor 345 while operating the vacuum pump 346.

A seal cap 319 as a lid for furnace opening configured to hermetically seal a lower end opening of the manifold 309 is installed under the manifold 309. The seal cap 319 is configured to contact the lower end of the manifold 309 from the lower side of the manifold 309 in the vertical direction. The seal cap 319 is made of metal such as, e.g., stainless and has a disc shape. An O-ring 320b, which is a seal member in contact with the lower end portion of the manifold 309, is installed at an upper surface of the seal cap 319. A rotary mechanism 367 configured to rotate the boat 317 described later is installed at a side of the seal cap 319 opposite to the process chamber 301. A rotary shaft 355 of the rotary mechanism 367 extends through the seal cap 319 and is connected to the boat 317. The rotary mechanism 267 is configured to rotate the wafers 200 by rotating the boat 317. The seal cap 319 is configured to be vertically elevated or lowered by a boat elevator 315, which is an elevation mechanism disposed at the outside of the reaction tube 303, enabling the boat 317 to be loaded into or unloaded from the process chamber 301.

The boat 317, which is used as a substrate support, is configured to support a plurality of wafers 200, e.g., 25 to 200 sheets, in a state where horizontally-positioned wafers 200 are vertically stacked in multiple stages, i.e., being separated from each other, with the centers of the wafers 200 aligned with each other. The boat 317 is made of a heat resistant material such as, e.g., quartz or SiC. In addition, a heat insulating member 318 made of a heat resistant material such as, e.g., quartz or SiC, is installed at a lower portion of the boat 317. With this configuration, heat from the heater 307 is difficult to be transferred to the seal cap 319. A temperature sensor 363, which is a temperature detector, is installed in the reaction tube 303. A condition of current applying to the heater 307 is adjusted based on temperature information detected by the temperature sensor 363, so that the interior of the process chamber 301 has a desired temperature distribution. The temperature sensor 363 is installed along the inner wall of the reaction tube 303, like the nozzles 333a and 333b.

A controller 380 serving as a control part (control unit) is configured to control the operations of the APC valve 342, the heater 307, the temperature sensor 363, the vacuum pump 346, the rotary mechanism 367, the boat elevator 315, the valves va1 to va5, vb1 to vb5, vc1 to vc5, vd1 to vd3, ve1 to ve3, vf1 to vf3, the MFCs 222a to 222f, and the like.

Subsequently, the substrate processing using the processing furnace of the above-described vertical apparatus will be described. In the following description, the operations of respective parts that constitute the vertical apparatus are controlled by the controller 380.

The plurality of wafers 200 are charged on the boat 317 (wafer charging). Further, as illustrated in FIG. 10A, the boat 217 holding the plurality of wafers 200 is lifted up by the boat elevator 315 to be loaded into the process chamber 301 (boat loading). In this state, the seal cap 319 seals the lower end portion of the manifold 309 via the O-ring 320b.

The interior of the process chamber 301 is evacuated by the vacuum pump 346 to reach a desired pressure (vacuum level). At this time, the internal pressure of the process chamber 201 is measured by the pressure sensor 345, and the APC valve 342 is feedback-controlled based on the measured pressure information. Further, the interior of the process chamber 301 is heated by the heater 307 to reach a desired temperature. At this time, a condition of current applying to the heater 307 is feedback-controlled based on temperature information detected by the temperature sensor 363, so that the interior of the process chamber 301 has a desired temperature distribution. Subsequently, the wafers 200 are rotated by rotating the boat 360 by way of the rotary mechanism 367.

Thereafter, a substrate processing is performed to grow a laminated film on the wafer 200. The procedures or conditions for growing the laminated film may be the same as those for growing the laminated film in the embodiment using, for example, the foregoing single-wafer type apparatus.

After a laminated film having a predetermined thickness is grown on the wafer 200, a $N_2$ gas is supplied into the process chamber 301, and the interior of the process chamber 301 is exhausted. Accordingly, the residual gas remaining in the process chamber 301 and reaction by-products may be removed and the interior of the process chamber 301 is purged by the $N_2$ gas.

Thereafter, the seal cap 319 is lowered by the boat elevator 315 to open a lower end of the manifold 309, and the wafer 200 with the laminated film grown thereon and held in the boat 317 is unloaded from the lower end of the manifold 309 to the outside of the reaction tube 303 (boat unloading). Thereafter, the processed wafers 200 are discharged from the boat 317 (wafer discharging), and the substrate processing is completed. Even in the case of performing the substrate processing using the vertical apparatus, the same effects as those of the case of performing the substrate processing apparatus using the single-wafer type apparatus can be obtained.

Further, the above-described embodiment, modifications, and the like may be appropriately combined to be used. In addition, the process conditions at this time may be the same as those of the above-described embodiment, for example.

Examples

As an example, a laminated film was grown on a substrate by alternately growing an SbTe layer and a GeTe layer through the same process as that of the film forming sequence illustrated in FIG. 5. An example of a structure near a surface of a substrate according to this example will be described with reference to FIG. 9A. A conductive layer 100a formed of TiN is laminated on an insulating film 90 formed of SiO, and a conductive film 100 formed of W is laminated on the conductive layer 100a. A conductive layer 100b formed of TiN is laminated on the conductive film 100, and an insulating film 101 is laminated on the conductive layer 100b.

The insulating film 101 is formed by laminating an insulating layer 101a formed of SiN, an insulating layer 101b formed of SiN, and an insulating layer 101c formed of SiO. The conductive layer 100b and the insulating layer 101a are formed on an upper surface of the conductive film 100. The insulating layer 101b is formed on the insulating layer 101a, and the insulating layer 101b covers side surfaces of the insulating layer 101a, the conductive layer 100b, the conductive film 100, and the conductive layer 100a, and covers an upper surface of the insulating film 90 at an outside of the conductive layer 100a. The insulating layer 101c is formed on the insulating layer 101b. A concave portion 102 is formed on a surface of the substrate such that an upper surface of the conductive film 100 is exposed from the bottom of the concave portion 102, and a side surface of a through hole formed in the conductive layer 100b and the insulating film 101 forms a side surface of the concave portion 102. That is, side surfaces of the conductive layer 100b and the insulating layers 101a to 101 c are exposed on the side surface of the concave portion 102.

A thickness of the insulating film 90 is within a range of, for example, 100 to 300 nm, and specifically, within a range of 100 to 200 nm. A thickness of the conductive layer 100a is within a range of, for example, 1 to 10 nm, and specifically, within a range of 5 to 10 nm. A thickness of the conductive film 100 may be within a range of, for example, 50 to 200 nm, and specifically, within a range of 50 to 100 nm.

A thickness of the conductive layer 100b is within a range of, for example, 1 to 10 nm, and specifically, within a range of 5 to 10 nm. A thickness of the insulating layer 101a is within a range of, for example, 20 to 50 nm, and specifically, within a range of 20 to 30 nm. A thickness of the insulating layer 101b may be within a range of, for example, 20 to 50 nm, and specifically, within a range of 20 to 30 nm. Further, since the thickness of the conductive layer 100b is so thin as to be 10 nm or less, the growth of a laminated film from the side surface of the conductive layer 100b is suppressed.

As the Sb precursor, TDMASb was used, as a Te precursor, DTBTe was used, and as a Ge precursor, the Ge precursor of FIG. 8 was used. As an SbTe layer, an SbTe layer having Sb:Te=2:3 was grown, and as a GeTe layer, a GeTe layer having Ge:Te=1:1 was grown.

Figure 9A:
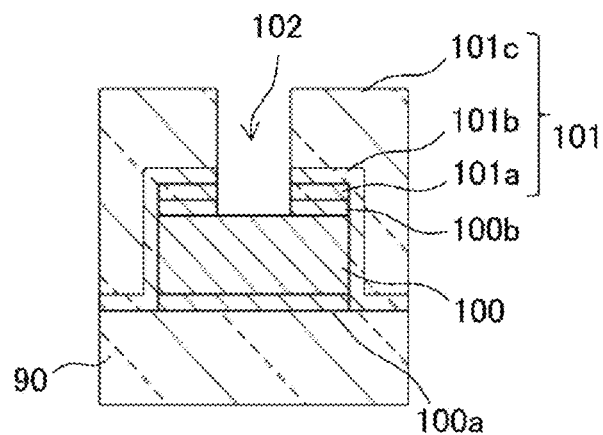
FIG. 9A is a cross-sectional view schematically illustrating a substrate structure according to an example.
Figure 9B:
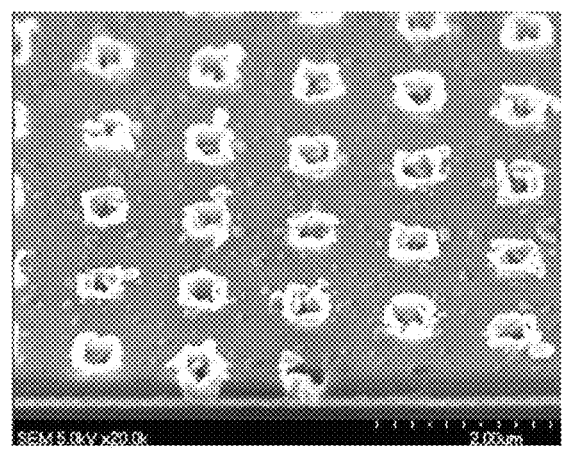
FIGS. 9B and 9C are SEM images of a laminated film according to an example.
Figure 9C:
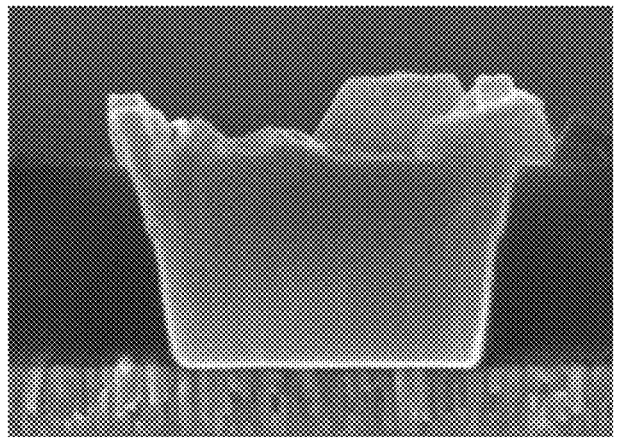

FIGS. 9B and 9C are scanning electron microscope (SEM) images illustrating grown laminated films. FIG. 9B is an SEM image obtained by observing a substrate with a laminated film grown thereon slantingly from above, and the white portions having the circular ring shape observed in FIG. 9B correspond to the protrusion 105a illustrated in FIG. 7B. FIG. 9C is an SEM image obtained by observing a cross-section (longitudinal cross-section) of the laminated film grown in a single concave portion.

As can be seen from the SEM images of FIGS. 9A and 9B, the laminated film was selectively grown from the lower surface side of the concave portion in a bottom-up manner, and is not grown on the insulating film at the outside of the concave portion. Thus, it was confirmed that the laminated film can be selectively grown on the conductive film. In addition, as described with reference to FIG. 7C, the protrusion of the upper surface of the laminated film can be removed through CMP.

Aspects of the Present Disclosure

Hereinafter, some aspects of the present disclosure are additionally described as supplementary notes.

(Supplementary Note 1)

According to one aspect of the present disclosure, there is provided a method of manufacturing a semiconductor device or a substrate processing method, including: growing a first layer including a first element and a second element by supplying a first precursor containing the first element and a second precursor containing the second element to the substrate, an insulating film, and a conductive film containing at least one selected from a group consisting of a metal element, a semi-metal element, and a semiconductor element being exposed on a surface of the substrate; and growing a second layer including the second element and a third element by supplying the second precursor and a third precursor containing the third element to the substrate, wherein the act of growing the first layer and the act of growing the second layer are alternately performed a predetermined number of times, and the act of growing the first layer is performed before the act of growing the second layer to selectively grow a laminated film on the conductive film exposed on the surface of the substrate, the first layer and the second layer being laminated to form the laminated film.

(Supplementary Note 2)

In the method according to Supplementary Note 1, the first element may be antimony (Sb), the second element may be tellurium (Te), and the third element may be germanium (Ge).

(Supplementary Note 3)

In the method according to Supplementary Note 1 or 2, the first precursor may contain at least one selected from a group consisting of an alkyl group and an amino group, the second precursor may contain an alkyl group, and the third precursor may contain at least one selected from a group consisting of an amino group and an amidine group.

(Supplementary Note 4)

In the method according to Supplementary Note 1 or 2, the first precursor may contain an alkyl group, the second precursor may contain an alkyl group, and the third precursor may contain an amidine group.

(Supplementary Note 5)

In the method according to any one of Supplementary Notes 1 to 4, when the act of growing the first layer is performed for the first time, the first layer may be selectively grown on the conductive film (without growing the first layer on the insulating film), and when the act of growing the second layer is performed for the first time, the second layer may be selectively grown on the first layer (without growing the second layer on the insulating film).

(Supplementary Note 6)

In the method according to Supplementary Note 5, when the act of growing the first layer is performed for the second time and thereafter, the first layer may be selectively grown on the second layer (without growing the first layer on the insulating film), and when the act of growing the second layer is performed for the second time and thereafter, the second layer may be selectively grown on the first layer (without growing the second layer on the insulating film).

(Supplementary Note 7)

In the method according to any one of Supplementary Notes 1 to 6, a concave portion may be formed on the surface of the substrate, the conductive film may be exposed on a lower surface of the concave portion, the insulating film may be exposed on a side surface of the concave portion, and the laminated film may be selectively grown on the lower surface of the concave portion (without growing the laminated film on the side surface of the concave portion).

(Supplementary Note 8)

In the method according to Supplementary Note 7, the laminated film may be grown from the lower surface of the concave portion in a bottom-up manner (without growing the laminated film from the side surface of the concave portion). A film formation in which a film is grown in such a manner (i.e., bottom-up manner) is also called a bottom-up film formation.

(Supplementary Note 9)

In the method according to Supplementary Note 7 or 8, when the act of growing the first layer is performed for the first time, the first layer may be selectively grown on the lower surface of the concave portion (without growing the first layer on the side surface of the concave portion), and when the act of growing the second layer is performed for the first time, the second layer may be selectively grown on the first layer (without growing the second layer on the side surface of the concave portion).

(Supplementary Note 10)

In the method according to Supplementary Note 9, when the act of growing the first layer is performed for the second time and thereafter, the first layer may be selectively grown on the second layer (without growing the first layer on the side surface of the concave portion), and when the act of growing the second layer is performed for the second time and thereafter, the second layer may be selectively grown on the first layer (without growing the second layer on the side surface of the concave portion).

(Supplementary Note 11)

In the method according to any one of Supplementary Notes 1 to 10, the laminated film may be a nano-laminated film composed of the first layer and the second layer alternately laminated at a nano scale thickness.

(Supplementary Note 12)

The method according to any one of Supplementary Notes 1 to 11 may further include chemical-mechanical polishing an upper surface of the laminated film. That is, the method may further include planarizing an upper surface of the laminated film by using chemical-mechanical polishing.

(Supplementary Note 13)

According to another aspect of the present disclosure, there is provided a substrate processing apparatus, including: a process chamber configured to accommodate a substrate; a first precursor supply system configured to supply a first precursor containing a first element into the process chamber; a second precursor supply system configured to supply a second precursor containing a second element into the process chamber; a third precursor supply system configured to supply a third precursor containing a third element into the process chamber; and a controller configured to control the first precursor supply system, the second precursor supply system, and the third precursor supply system so as to perform: growing a first layer including the first element and the second element by supplying the first precursor and the second precursor to the substrate in the process chamber, an insulating film, and a conductive film containing at least one selected from a group consisting of a metal element, a semi-metal element, and a semiconductor element being exposed on a surface of the substrate; and growing a second layer including the second element and the third element by supplying the second precursor and the third precursor to the substrate in the process chamber, wherein the act of growing the first layer and the act of growing the second layer are alternately performed a predetermined number of times, and the act of growing the first layer is performed before the act of growing the second layer to selectively grow a laminated film on the conductive film exposed on the surface of the substrate, the first layer and the second layer being laminated to form the laminated film.

(Supplementary Note 14)

According to still another aspect of the present disclosure, there is provided a non-transitory computer-readable recording medium storing a program that causes a computer to perform a process of: growing a first layer including a first element and a second element by supplying a first precursor containing the first element and a second precursor containing the second element to a substrate, an insulating film, and a conductive film containing at least one selected from a group consisting of a metal element, a semi-metal element, and a semiconductor element being exposed on a surface of the substrate; and growing a second layer including the second element and a third element by supplying the second precursor and a third precursor containing the third element to the substrate, wherein the act of growing the first layer and the act of growing the second layer are alternately performed a predetermined number of times, and the act of growing the first layer is performed before the act of growing the second layer to selectively grow a laminated film on the conductive film exposed on the surface of the substrate, the first layer and the second layer being laminated to form the laminated film.

According to the present disclosure in some embodiments, it is possible to selectively grow a laminated film formed by laminating a first layer and a second layer on a predetermined region of a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate having an insulating film and a conductive film, which are exposed on a surface of the substrate, comprising:
    selectively growing a laminated film on the conductive film by alternately performing a predetermined of times:
        growing a first layer including a first element and a second element by supplying a first precursor containing the first element and a second precursor containing the second element to the substrate; and
        growing a second layer including the second element and a third element by supplying the second precursor and a third precursor containing the third element to the substrate,
    wherein the conductive film contains at least one selected from a group consisting of a metal element, a semi-metal element, and a semiconductor element,
    wherein in the act of selectively growing the laminated film, the act of growing the first layer is performed before the act of growing the second layer, and the first layer and the second layer are laminated to form the laminated film,
    wherein the first element is antimony, the second element is tellurium, and the third element is germanium,
    wherein, when the act of growing the first layer is performed for the first time, the first layer is selectively grown on the conductive film, and when the act of growing the second layer is performed for the first time, the second layer is selectively grown on the first layer, and
    wherein the act of selectively growing the laminated film includes growing the laminated film as a superlattice by adjusting a thickness of the laminated film, a ratio of the first precursor and the second precursor, and a ratio of the second precursor and the third precursor.

2. The method of claim 1, wherein the first precursor contains at least one selected from a group consisting of an alkyl group and an amino group, the second precursor contains an alkyl group, and the third precursor contains at least one selected from a group consisting of an amino group and an amidine group.

3. The method of claim 1, wherein the first precursor contains an alkyl group, the second precursor contains an alkyl group, and the third precursor contains an amidine group.

4. The method of claim 1, wherein when the act of growing the first layer is performed for the second time and thereafter, the first layer is selectively grown on the second layer, and
    when the act of growing the second layer is performed for the second time and thereafter, the second layer is selectively grown on the first layer.

5. The method of claim 1, wherein a concave portion is formed on the surface of the substrate,
    the conductive film is exposed on a lower surface of the concave portion,
    the insulating film is exposed on a side surface of the concave portion, and
    the laminated film is selectively grown on the lower surface of the concave portion.

6. The method of claim 5, wherein the laminated film is grown from the lower surface of the concave portion in a bottom-up manner.

7. The method of claim 5, wherein when the act of growing the first layer is performed for the first time, the first layer is selectively grown on the lower surface of the concave portion, and
    when the act of growing the second layer is performed for the first time, the second layer is selectively grown on the first layer.

8. The method of claim 7, wherein, when the act of growing the first layer is performed for the second time and thereafter, the first layer is selectively grown on the second layer, and
    when the act of growing the second layer is performed for the second time and thereafter, the second layer is selectively grown on the first layer.

9. The method of claim 1, wherein the laminated film is a nano-laminated film composed of the first layer and the second layer alternately laminated at a nano scale thickness.

10. The method of claim 1, further comprising chemical-mechanical polishing an upper surface of the laminated film.

* * * * *